US010049817B2

(12) United States Patent
Adamson et al.

(10) Patent No.: US 10,049,817 B2
(45) Date of Patent: *Aug. 14, 2018

(54) DIELECTRIC MATERIALS USING 2D NANOSHEET NETWORK INTERLAYER

(71) Applicant: University of Connecticut, Farmington, CT (US)

(72) Inventors: Douglas H. Adamson, Mansfield Center, CT (US); Zhenhua Cui, Thompson, CT (US); Andrey V. Dobrynin, Willington, CT (US)

(73) Assignee: University of Connecticut, Farmington, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/186,755

(22) Filed: Jun. 20, 2016

(65) Prior Publication Data
US 2016/0372263 A1    Dec. 22, 2016

Related U.S. Application Data

(60) Provisional application No. 62/182,031, filed on Jun. 19, 2015.

(51) Int. Cl.
*H01B 13/00* (2006.01)
*H01B 1/00* (2006.01)
(Continued)

(52) U.S. Cl.
CPC .............. *H01G 4/14* (2013.01); *C30B 29/403* (2013.01); *C30B 29/64* (2013.01)

(58) Field of Classification Search
CPC ........... H01B 13/00; H01B 13/30; H01B 1/00
See application file for complete search history.

(56) References Cited

U.S. PATENT DOCUMENTS 9,685,261 B2 * 6/2017 Adamson ............... H01B 13/30
2004/0195206 A1 * 10/2004 Hiraga .................... C23C 14/12
216/58
(Continued)

OTHER PUBLICATIONS

Suk, Ji Won et al. "Transfer of CVD-Grown Monolyaer Graphene onto Aribitrary Substrates." 2011. American Chemical Society. vol. 5, No. 9, pp. 6916-6924.*

(Continued)

*Primary Examiner* — Jacob T Minskey
*Assistant Examiner* — Matthew Hoover
(74) *Attorney, Agent, or Firm* — McCarter & English, LLP

(57) ABSTRACT

The present disclosure provides advantageous composite films/coatings, and improved methods for fabricating such composite films/coatings. More particularly, the present disclosure provides improved methods for fabricating composite films by trapping at least a portion of a layered material (e.g., hexagonal boron nitride sheets/layers) at an interface of a phase separated system and then introducing the layered material to a polymer film. The present disclosure provides for the use of boron nitride layers to increase the properties (e.g., dielectric constant and breakdown voltage) of polymer films. The exemplary films can be produced by an advantageous climbing technique. Exemplary boron nitride films are composed of overlapping boron nitride sheets with a total thickness of about one nanometer, with the film then transferred onto a polymer film, thereby resulting in significant increases in both dielectric and breakdown properties of the polymer film.

19 Claims, 26 Drawing Sheets

(51) Int. Cl.
  *H01G 4/14* (2006.01)
  *C30B 29/40* (2006.01)
  *C30B 29/64* (2006.01)

(56) References Cited

U.S. PATENT DOCUMENTS

| | | | |
|---|---|---|---|
| 2007/0108490 A1 | 5/2007 | Tan et al. | |
| 2014/0234200 A1* | 8/2014 | Tour | C01B 31/0446 423/448 |
| 2014/0305571 A1 | 10/2014 | Adamson et al. | |
| 2015/0118144 A1* | 4/2015 | Cao | C01G 19/00 423/508 |

OTHER PUBLICATIONS

Domingues, Sergio H et al. "Transparent and Conductive Thin Films of Graphene/Polyaniline Nanocomposites Prepared Through Interfacial Polymerization." 2011. ChemComm, Royal Society of Chemistry. vol. 47, pp. 2592-2594.*
Zunger et al., Optical Properties of Hexagonal Boron Nitride, Physical Review B 1976, 13 (12), 5560-5573.
Price et al., A Modified TIP3P Water Potential for Simulation with Ewald Summation, The Journal of Chemical Phsyics 2004, 121 (20), 10096-10103.
Watanabe et al., Direct-Bandgap Properties and Evidence for Ultraviolet Lasing of Hexagonal Boron Nitride Single Crystal; Advanced Materials, Laboratory, National Institute of Materials Science, 2004, 3 (6), 404-409.
Chu et al., A Dielectric, Polymer with High Electric Energy Density and Fast Discharge Speed, Science 2006, 313 (5785), 334-336.
Dean et al., Nature Nanotech 2010, 5 (10), 722-6.
Song et al., Large Scale Growth and Characterization of Atomic Hexagonal Boron Nitride Layers, Nano Letters, 2010, 10 (8), 3209-3215.
Coleman et al., Two-Dimensional Nanosheets Produced by Liquid Exfoliation of Layered Materials, Science 2011, 331 (6017), 568-571.
Gorbachev et al., Hunting for Monolayer Boron Nitride: Optical and Raman Signatures, Small 2011, 7 (4), 465-468.
Liu et al., Direct Growth of Graphene/Hexagonal Boron Nitride Stacked Layers, Nano Letters, 2011, 11 (5), 2032-2037.
Wang et al.,"Chemical Blowing" of Thin-Walled Bubbles: High-Throughput Fabrication of Large-Area, Few-Layered BN and $C_x$—BN Nanosheets, Advanced Materials 2011, 23 (35), 4072-4076.
Britnell et al., Field-Effect Tunneling Transistor Based on Vertical Graphene Heterostructures, Science 2012, 335 (6071), 947-950.
Kim et al., Synthesis and Characterization of Hexagonal Boron Nitride Film as a Dielectric Layer for Graphene Devices, ACS Nano 2012, 6 (10), 8583-8590.
Lee et al., Large-Scale Synthesis of High-Quality Hexagonal Boron Nitride Nanosheets for Large-Area Graphene Electronics, Nano Letters, 2012, 12 (2), 714-718.
Osada et al., Two-Dimensional Dielectric Nanosheets: Novel Nanoelectronics From Nanocrystal Building Blocks, Advanced Materials, 2012, 24 (2), 210-228.
Wang et al., Synthesis, Structure, and Photovoltaic Property of a Nanocrystalline 2H Perovskite-Type Novel Sensitizer $(CH_3CH_2NH_3)PbI_3$, Nanoscale Research Letters, 2012, 7 (1), 1-7.
Young et al., Electronic Compressibility of Layer-Polarized Bilayer Graphene, Physical Review B, 2012, 85 (23), 235458.
Wang et al., A Platform for Large-Scale Graphene Electronics—CVD Growth of Single-Layer Graphene on CVD-Grown Hexagonal Boron Nitride; Advanced Materials, 2013, 25 (19), 2746-2752.
Woltornist, S. J., et al., Conductive Thin Films of Pristine Graphene by Solvent Interface Trapping, ACS Nano 7, 7062-66 (2013).
Li et al., High Energy and Power Density Capacitors From Solution-Processed Ternary Ferroelectric Polymer Nanocomposites, Advanced Materials, 2014, 26 (36), 6244-6249.
Pierret et al., Excitonic Recombinations in h-BN: From Bulk to Exfoliated Layers, Physical Review B, 2014, 89 (3), 035414.
Takahashi et al., Dielectric and Thermal Properties of Isotatctic Polypropylene/Hexagonal Boron Nitride Composites for High-Frequency Applications, Journal of Alloys and Compounds, 2014, 615 (0), 141-145.
Wang et al., Monolayer Hexagonal Boron Nitride Films With Large Domain Size and Clean Interface for Enhancing the Mobility of Graphene-Based Field-Effect Transistors; Advanced Materials, 2014, 26 (10), 1559-1564.
Zhang et al., Controllable Co-Segregation Synthesis of Wafer-Scale, Hexagonal Boron Nitride Thin Films, Advanced Materials, 2014, 26 (11), 1776-1781.
Woltornist et al., Polymer/Pristine Graphene Based Composites: From Eulsions to Strong, Electrically Conducting Foams, Macromolecules, 2015, 48 (3), 687-693.
Zhang et al., Ferroelectric Polymer Nanocomposites for Room-Temperature Electrocaloric Refrigeration, Advanced Materials, 2015, 27 (8), 1450-54.
U.S. Appl. No. 62/182,031, filed Jun. 19, 2015.

* cited by examiner the present application claims priority benefit...

DIELECTRIC MATERIALS USING 2D NANOSHEET NETWORK INTERLAYER

CROSS-REFERENCE TO RELATED APPLICATION

The present application claims priority benefit to a provisional application entitled "Dielectric Materials Using 2D Nanosheet Network Interlayer," which was filed on Jun. 19, 2015, and designated by Ser. No. 62/182,031. The entire content of the foregoing provisional patent application is incorporated herein by reference.

FIELD OF THE DISCLOSURE

The present disclosure relates to composite films/coatings and methods for fabricating composite films/coatings and, more particularly, to methods for fabricating composite films by trapping at least a portion of a layered material (e.g., hexagonal boron nitride sheets or layers) at an interface of a phase separated system (e.g., at an interface of two non-mixing solvents) and then introducing the layered material to a polymer film.

BACKGROUND OF THE DISCLOSURE

In general, the propensity of boron nitride (BN) sheets to stack creates obstacles for their application as multifunctional materials despite their unique thermal, mechanical, and electrical properties.

For example, the exceptional thermal, mechanical, and electrical properties of high aspect ratio hexagonal boron nitride (BN) sheets make BN an attractive candidate for the design of multifunctional composite materials. However, similar to graphene, BN's propensity to restack after exfoliation, coupled with its chemical inertness, creates obstacles for its applications. While graphite, composed of only carbon, is known to be an electrical conductor, the different electro-negativities of boron and nitrogen result in BN being an insulator with a large bandgap (ca. 6 eV), a dielectric constant of about 5, and a breakdown voltage of 800 MV/m, suggesting a tremendous potential for electronic and energy storage applications.

In general, capacitors are currently being used with polymers that have low dielectric properties. Materials with higher dielectric properties generally cannot be used due to either processing constraints or low breakdown voltages.

Thus, an interest exists for improved multifunctional composite materials, and related fabrication methods. These and other inefficiencies and opportunities for improvement are addressed and/or overcome by the systems, assemblies and methods of the present disclosure.

SUMMARY OF THE DISCLOSURE

The present disclosure provides advantageous composite films/coatings, and improved methods for fabricating such composite films/coatings. More particularly, the present disclosure provides improved methods for fabricating composite films by trapping at least a portion of a layered material (e.g., hexagonal boron nitride sheets or layers) at an interface of a phase separated system (e.g., at an interface of two non-mixing solvents) and then introducing the layered material to a polymer film.

In exemplary embodiments, the present disclosure provides for the use of boron nitride layers (e.g., hexagonal boron nitride layers) to increase the dielectric constant and breakdown voltage of polymer films. The exemplary boron nitride films can be produced by a climbing technique described and disclosed in U.S. patent application Ser. No. 14/248,547 and 61/812,285, and Woltornist, S. J., Oyer, A. J., Carrillo, J.-M. Y., Dobrynin, A. V & Adamson, D. H., *Conductive Thin Films Of Pristine Graphene By Solvent Interface Trapping*, ACS Nano 7, 7062-66 (2013), the entire contents of each being hereby incorporated by reference in their entireties. This research has shown film climbing using an interface trapping method in a heptane and water mixture.

These exemplary boron nitride films are composed of overlapping boron nitride sheets with a total thickness of approximately two to five sheets. This exemplary film is then transferred onto a polymer film, thereby advantageously resulting in significant increases in both dielectric and breakdown properties.

The morphology and structure of the few-layer sheets were analyzed by scanning electron microscopy (SEM), transmission electron microscopy (TEM) and Raman spectroscopy. The sheets incorporated polymer film with the uniquely orientated boron nitride nanosheets interlayer configuration displayed remarkably improved dielectric properties and breakdown strength, providing a new aspect of polymer nano-composites (e.g., for dielectric applications or the like). In exemplary embodiments, these coatings can increase the energy storage of current capacitors without requiring the use of new polymers or capacitor configurations. In some embodiments, about 20% of the film is open: there are gaps in the film with no layered material at all.

The present disclosure provides for a method for fabricating a composite film including: a) providing a phase separated system, the phase separated system including: (i) a first material and a second material, and (ii) an interface between the first and second materials; b) introducing a layered material to the phase separated system; c) inserting a substrate into the interface of the phase separated system and allowing at least a portion of the layered material to be associated with the substrate; and d) removing the substrate from the phase separated system and allowing the portion of the layered material associated with the substrate to dry; e) introducing a polymer to the layered material to form a composite film.

The present disclosure also provides for a method for fabricating a composite film wherein the layered material includes boron nitride. The present disclosure also provides for a method for fabricating a composite film wherein the layered material is hexagonal boron nitride. The present disclosure also provides for a method for fabricating a composite film wherein the layered material of the composite film includes individual sheets or layers of boron nitride.

The present disclosure also provides for a method for fabricating a composite film wherein the layered material of the composite film has a total thickness of about one nanometer. The present disclosure also provides for a method for fabricating a composite film wherein the layered material of the composite film includes overlapping boron nitride sheets or layers.

The present disclosure also provides for a method for fabricating a composite film wherein the layered material of the composite film includes from about one sheet or layer to about nine sheets or layers of boron nitride, and wherein there are gaps in the composite film with no layered material.

The present disclosure also provides for a method for fabricating a composite film wherein after step e), the layered material is an interlayer of the composite film. The present disclosure also provides for a method for fabricating a composite film wherein step e) includes embedding the layered material into the polymer to form the composite film.

The present disclosure also provides for a method for fabricating a composite film further including, after step e), the step of removing the composite film from the substrate. The present disclosure also provides for a method for fabricating a composite film wherein the step of introducing the polymer to the layered material includes drop casting a polymer solution onto the dried layered material; and further including, after step e), the steps of allowing the polymer solution to dry, and removing the dried composite film from the substrate.

The present disclosure also provides for a method for fabricating a composite film wherein step e) includes coating the polymer onto the layered material to form the composite film. The present disclosure also provides for a method for fabricating a composite film wherein the formed composite film has a low frequency dielectric constant around 5, and an energy storage capacity around 4.9 $J/cm^3$.

The present disclosure also provides for a method for fabricating a composite film wherein the polymer includes poly(methyl-methacrylate) or polypropylene.

The present disclosure also provides for a method for fabricating a composite film wherein the phase separated system is an oil and water based system. The present disclosure also provides for a method for fabricating a composite film wherein the phase separated system is a system of two substantially non-mixing solvents. The present disclosure also provides for a method for fabricating a composite film wherein the first material is water and the second material is heptane.

The present disclosure also provides for a method for fabricating a composite film wherein the step of introducing the polymer to the layered material includes hot pressing a polymer film to the dried layered material.

The present disclosure also provides for a method for fabricating a composite film including: a) providing a phase separated system, the phase separated system including: (i) a first material and a second material, and (ii) an interface between the first and second materials; b) introducing boron nitride to the phase separated system; c) inserting a substrate into the interface of the phase separated system and allowing at least a portion of the boron nitride to be associated with the substrate; and d) removing the substrate from the phase separated system and allowing the portion of the boron nitride associated with the substrate to dry; e) introducing a polymer to the dried boron nitride to form a composite film; wherein boron nitride of the composite film includes individual sheets or layers of boron nitride; wherein the boron nitride of the composite film has a total thickness of about one nanometer; wherein the boron nitride of the composite film includes overlapping boron nitride sheets or layers; and wherein after step e), the boron nitride is an interlayer of the composite film.

The present disclosure also provides for a composite film including a polymer film including a layered material, the layered material including individual sheets or layers of boron nitride.

The present disclosure also provides for a composite film wherein the layered material of the composite film has a total thickness of about one nanometer.

The present disclosure also provides for a composite film wherein the layered material includes overlapping boron nitride sheets or layers. The present disclosure also provides for a composite film wherein the layered material includes from about one sheet or layer to about nine sheets or layers of boron nitride.

The present disclosure also provides for a composite film wherein the layered material is an interlayer of the polymer film. The present disclosure also provides for a composite film wherein the layered material is embedded in the polymer film.

The present disclosure also provides for a composite film wherein the layered material is coated on the polymer film. The present disclosure also provides for a composite film wherein the polymer film has a low frequency dielectric constant around 5, and an energy storage capacity around 4.9 $J/cm^3$. The present disclosure also provides for a composite film wherein the polymer film includes poly(methyl-methacrylate) or polypropylene.

Any combination or permutation of embodiments is envisioned. Additional advantageous features, functions and applications of the disclosed systems, assemblies and methods of the present disclosure will be apparent from the description which follows, particularly when read in conjunction with the appended figures. All references listed in this disclosure are hereby incorporated by reference in their entireties.

BRIEF DESCRIPTION OF THE DRAWINGS

Features and aspects of embodiments are described below with reference to the accompanying drawings, in which elements are not necessarily depicted to scale.

Exemplary embodiments of the present disclosure are further described with reference to the appended figures. It is to be noted that the various steps, features and combinations of steps/features described below and illustrated in the figures can be arranged and organized differently to result in embodiments which are still within the scope of the present disclosure. To assist those of ordinary skill in the art in making and using the disclosed systems, assemblies and methods, reference is made to the appended figures, wherein:

FIG. 8A shows displacement of the boron atom.

FIG. 8B shows displacement of the nitrogen atom.

FIG. 8C shows displacement of the boron and nitrogen atoms.

FIG. 9A shows B—H bond deformation.

FIG. 9B shows N—B—H bond angle deformation.

FIG. 9C shows N—H bond deformation.

FIG. 9D shows B—N—H bond angle deformation.

FIG. 10A shows the displacement of the boron atom.

FIG. 10B shows the displacement of the nitrogen atom.

FIG. 10C shows the displacement of the boron and nitrogen atoms in the same direction.

FIG. 10D shows the displacement of the boron nitrogen atoms in the opposite directions.

DETAILED DESCRIPTION OF DISCLOSURE

Figure 1A:
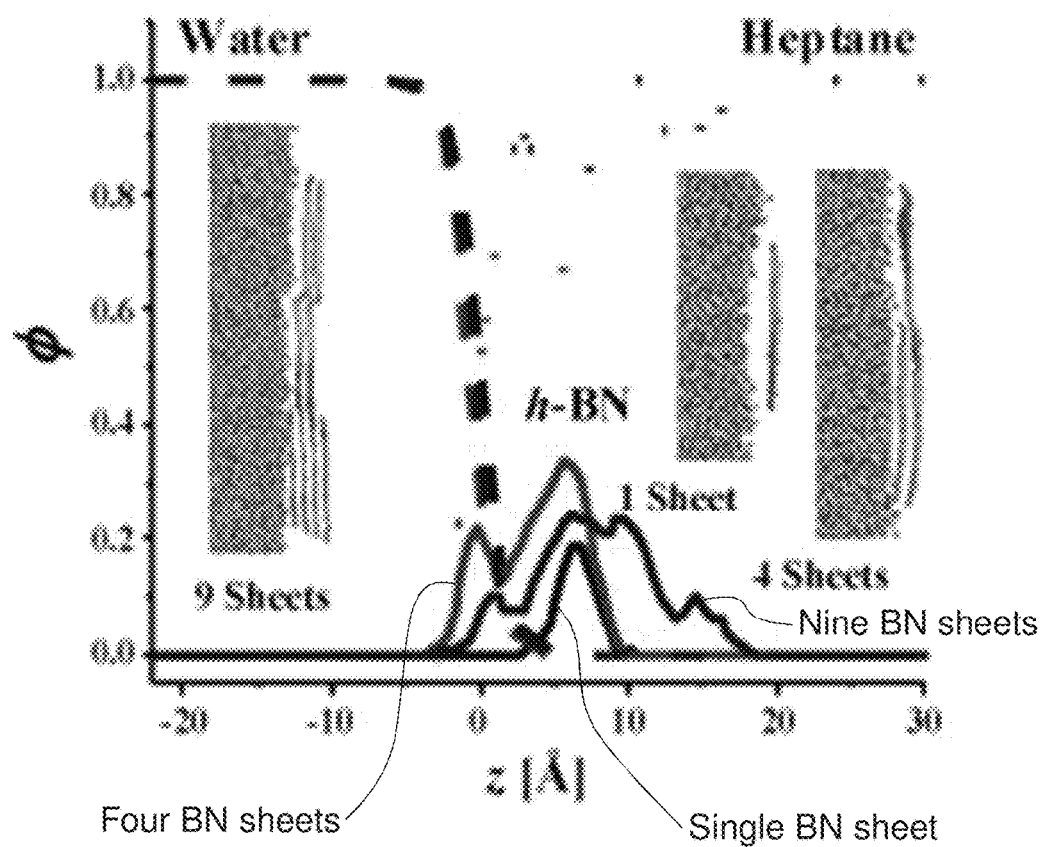
FIG. 1A shows the number fraction distributions of atoms belonging to water molecules, heptane molecules, and BN sheets along the z-axis normal to the water/heptane interface for water/heptane mixtures containing a single BN sheet, four BN sheets, and nine BN sheets. Number fraction distribution curves of atoms belonging to water molecules, heptane molecules and hBN sheets are shown as dash-dot lines, dot lines, and solid lines, respectively. Location of the origin of the z-axis is set to the location of the point where the number fraction of atoms belonging to water molecules outside the region occupied by the BN sheets decreases by half from its bulk value of $\varphi_{wat}=0.5$. Insets show typical configurations of the BN layers at the water/heptane interface. Solvent shown is water, and heptane molecules are transparent.

The exemplary embodiments disclosed herein are illustrative of advantageous composite films/coatings, and systems of the present disclosure and methods/techniques thereof. It should be understood, however, that the disclosed embodiments are merely exemplary of the present disclosure, which may be embodied in various forms. Therefore, details disclosed herein with reference to exemplary composites/fabrication methods and associated processes/techniques of assembly and use are not to be interpreted as limiting, but merely as the basis for teaching one skilled in the art how to make and use the advantageous composites/systems and/or alternative composites/systems of the present disclosure.

The present disclosure provides improved composite films/coatings, and improved methods for fabricating such composite films/coatings. More particularly, the present disclosure provides advantageous methods for fabricating composite films by trapping at least a portion of a layered material (e.g., hexagonal boron nitride sheets or layers) at an interface of a phase separated system (e.g., at an interface of two non-mixing solvents) and then introducing the layered material to a polymer film.

In general, the present disclosure provides for the use of boron nitride layers (e.g., hexagonal boron nitride layers) to increase the properties (e.g., dielectric constant and breakdown voltage) of polymer films. The exemplary films can be produced by an advantageous climbing technique (e.g, film climbing using an interface trapping method in a heptane and water mixture). It is noted that the disclosed systems, methods, techniques and assemblies are capable of use with other materials having a layered structure or the like.

Exemplary boron nitride films are composed of overlapping boron nitride sheets with a total thickness of about one to five sheets, with the film then transferred onto a polymer film, thereby resulting in significant increases in both dielectric and breakdown properties of the polymer film.

As noted, the morphology and structure of the few-layer sheets were analyzed by SEM, TEM and Raman spectroscopy. The sheets incorporated polymer film with the advantageously orientated boron nitride nano sheets interlayer configuration showed remarkably improved dielectric properties and breakdown strength, providing a new aspect of polymer nano-composites (e.g., for dielectric applications, etc.). It is noted that these coatings can increase the energy storage of current capacitors without requiring the use of new polymers or capacitor configurations.

Current practice provides that capacitors are conventionally being used with polymers that have low dielectric properties, and that materials with higher dielectric properties generally cannot be used due to either processing constraints or low breakdown voltages. In exemplary embodiments, the present disclosure provides for improved methods for allowing such polymers to increase their dielectric properties while retaining their processing benefits and even improving their breakdown voltages (e.g., by utilizing boron nitride layers to increase the dielectric constant and breakdown voltage of polymer films), thereby providing a significant commercial and manufacturing advantage as a result. As such, the exemplary systems and methods of the present disclosure provides, inter alia, an inexpensive route to significantly improve the performance of current capacitors. Moreover, the barrier to adoption is low, with significant increases expected in the energy storage capacity.

Exemplary preparation procedures of the BN nanosheets interlayered polymer films involves an easy and scalable exfoliation method and an incorporation procedure which can be achieved by, without limitation, either solution casting or melt processing. For the exfoliation method, just an organic solvent and water are needed for producing the nanosheets. The incorporation procedure can be coupled with current process techniques without the need of changing the instrument or set-up.

In exemplary embodiments, the present disclosure provides a new approach to the exfoliation of boron nitride (BN) sheets and their assembly into a layered composite using an advantageous exfoliation technique. Exemplary layered BN-polymer composite film includes BN platelets which lie parallel to the surface of the polymeric substrate rather than randomly distributed. This structural configuration or composition of matter displays significantly improved dielectric constants, breakdown voltages, and barrier properties when compared to BN films with random orientations. Even more surprising is that these improved properties are the result of an extremely small amount (e.g., less than 0.01% by mass) of BN compared to the polymer. The present disclosure shows that the overlapping sheet morphology of the BN is responsible, and that randomly dispersed BN generally does not give rise to the same effect.

This is an inexpensive route to significantly improve the performance of current capacitors. The barrier to adoption is low, with significant increases expected in the energy storage capacity. Current BN polymer capacitors are manufactured via a CVD process, or by random dispersion within a polymer layer.

As noted, current practice provides that the propensity of boron nitride (BN) sheets to stack creates obstacles for their application as multifunctional materials despite their unique thermal, mechanical, and electrical properties.

To address this challenge, exemplary embodiments of the present disclosure advantageously use a combination of molecular dynamics simulations and experimental techniques to demonstrate surfactant-like properties of BN sheets at the interface between immiscible solvents. The present disclosure shows that spreading of two-dimensional BN sheets at a high-energy oil/water interface lowers the free energy of the system, creating a situation in which films of overlapping BN sheets are more thermodynamically favorable than stacked sheets. This thermodynamically driven rearrangement of the BN sheets allows for the creation of stable BN films only a few sheets thick. Coating such films onto polymers results in composite materials with exceptional barrier and dielectric properties.

In exemplary embodiments, rather than meeting the challenge of BN exfoliation and stabilization by chemical functionalization, as is commonly done with graphite, this disclosure outlines a thermodynamically driven approach for the exfoliation and stabilization of BN at the interface between immiscible solvents. The present disclosure provides theoretical and experimental verification that the spreading of two-dimensional BN sheets at a high-energy oil/water interface lowers the free energy of the system, creating a situation in which films of overlapping BN sheets are more thermodynamically stable than stacked sheets. Thus by re-arranging the BN sheets from a stacked morphology to an overlapping arrangement of BN sheets covering an interface, the system lowers its energy. This interfacial exfoliation technique allows for the creation of BN films only a few sheets thick. The ease of this approach provides a significant advantage over CVD grown BN films that are brittle, hard to transfer, and expensive to produce. When the spreading technique is applied to coat polymer films with thin layers of overlapping BN sheets, the composite films have exceptional barrier and dielectric properties with a low frequency dielectric constant approaching 5, and reliable energy storage capacity estimated to be around 4.9 J/cm$^3$ for PMMA/BN composite films.

To demonstrate the BN sheet's surfactant-like properties and to understand the mechanism of the BN sheet's interface localization, atomistic molecular dynamics simulations of BN sheets at the interface between water and heptane were performed. In these simulations, the TIP3P force field potential for water and the Generalized Amber Force Field for the atomistic model of heptane were used. The boron nitride sheets were modeled as polycyclic boron nitride consisting of eight generations (G8) of BN rings terminated by hydrogen, $B_{192}N_{192}H_{48}$. The partial charges on the heptane and the G8 BN sheets were obtained from the Mulliken population analysis from ab initio calculations using the Gaussian09 simulation package with the 6-31G(d) basis set and B3LYP DFT (see Example 1 below). The parameters for potentials describing deformations of the bonds, bond angles, dihedral angles and improper angles are obtained by performing DFT calculations of the in-plane and out-of-plane G8 BN sheet deformations as described in Example 1 below. In the molecular dynamics simulations, the water/heptane systems containing one, four and nine BN sheets were studied, with the number of water and heptane molecules given in Table 1 below. The simulations were performed at T=300 K and pressure equal to 1 atm. The simulations were performed following methodology developed for modeling graphene flakes in water/heptane mixtures. See, e.g., U.S. patent application Ser. No. 14/248,547 and 61/812,285, and Woltornist, S. J., Oyer, A. J., Carrillo, J.-M. Y., Dobrynin, A. V & Adamson, D. H., *Conductive Thin Films Of Pristine Graphene By Solvent Interface Trapping*, ACS Nano 7, 7062-66 (2013), the entire contents of each being hereby incorporated by reference in their entireties. The details of the simulation procedure are described in Example 1 below.

FIG. 1A shows the distribution function of the atoms belonging to water, heptane and BN sheets obtained from molecular dynamics simulations of the systems containing a single sheet, four sheets, and nine sheets of BN. For multi-sheet simulations, the aggregation of the BN sheets and formation of a BN skin at the interface between water and heptane were observed (see insets in FIG. 1A). Formation of the multi-sheet aggregates is indicated by the appearance of the multiple peaks in the distribution function seen in FIG. 1A. It is interesting to note that the single BN sheet resides close to the water/heptane interface, but in the heptane phase, while sheets belonging to multi-sheet aggregates penetrate into the water phase in order to allow accommodation of the assembly in the interface region.

FIG. 1A shows the number fraction distributions of atoms belonging to water molecules, heptane molecules, and BN sheets along the z-axis normal to the water/heptane interface for water/heptane mixtures containing a single BN sheet, four BN sheets, and nine BN sheets. Number fraction distribution curves of atoms belonging to water molecules, heptane molecules and hBN sheets are shown as dash-dot lines, dot lines, and solid lines, respectively. Location of the origin of the z-axis is set to the location of the point where the number fraction of atoms belonging to water molecules outside the region occupied by the BN sheets decreases by half from its bulk value of $\varphi_{wat}=0.5$. Insets show typical configurations of the BN layers at the water/heptane interface. Solvent shown is water, and heptane molecules are transparent.

Figure 1B:
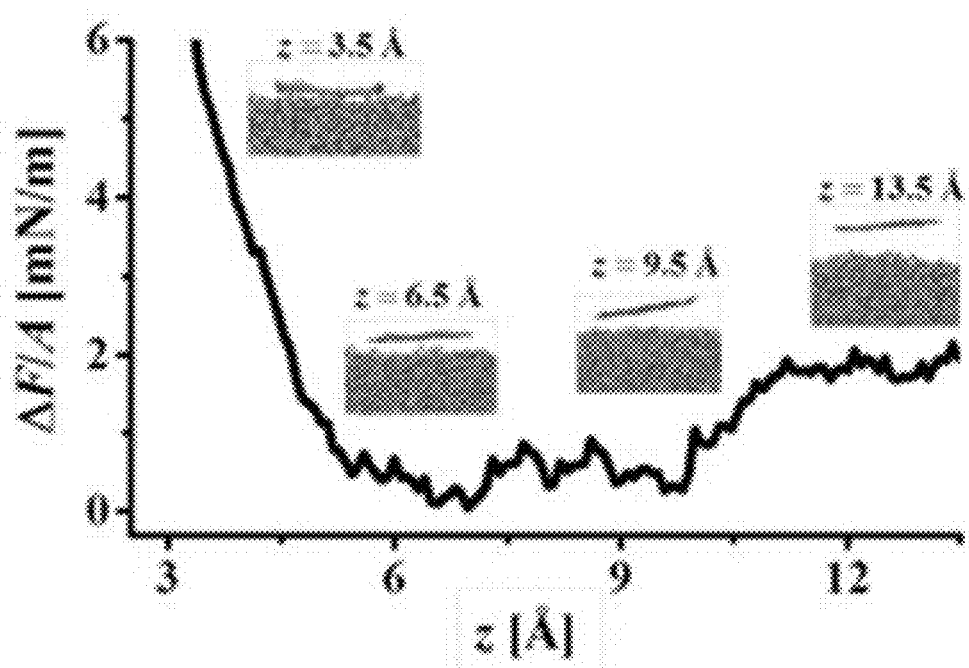
FIG. 1B shows the variation of the potential of the mean force normalized by the BN sheet surface area along the z-axis normal to the water/heptane interface. Insets show typical sheet configurations. The heptane phase is transparent.

FIG. 1B shows the variation of the potential of the mean force normalized by the BN sheet surface area along the z-axis normal to the water/heptane interface. Insets show typical sheet configurations. The heptane phase is transparent.

Figures 1C, 1D, 1E:
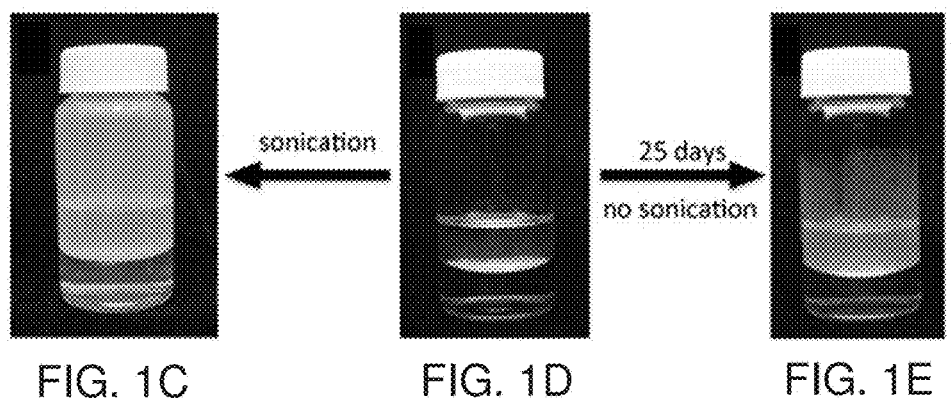
FIG. 1C shows the heptane/water mixture with added BN following brief bath sonication.
FIG. 1D shows the water/heptane/BN initial sample.
FIG. 1E shows the water/heptane/BN after sitting for 25 days with no sonication.

FIG. 1C shows the heptane/water mixture with added BN following brief bath sonication.

FIG. 1D shows the water/heptane/BN initial sample.

FIG. 1E shows the water/heptane/BN after sitting for 25 days with no sonication.

In order to establish the affinity of BN sheets to the water/heptane interface, the potential of the mean force along the z-axis normal to the water/heptane interface was calculated (see FIG. 1B) by using the Weighted Histogram Analysis Method. The minimum of the potential is located in the heptane phase, indicating the preference of BN for heptane rather than water. The increase of the potential in the heptane phase is not as steep as that observed in the water phase, an indication that heptane is a better solvent for BN than is water. The magnitude of the potential in the plateau regime is on the order of 1.8 mN/m. This free energy change is lower than the corresponding 2.2 mN/m change of the free energy obtained for graphene displacement from an interface using similar calculations. Using this value, the work required to displace BN sheets with 100×100 nm lateral dimensions from the water/heptane interface into the heptane phase was estimated to be 4420 kBT. This energy is sufficiently strong to localize the BN sheet at the water/heptane interface.

Results of the molecular dynamics simulations indicate that localization and spreading of BN sheets at the interface is driven by a reduction in the interfacial energy between oil and water. In order to experimentally confirm that this rearrangement of BN sheets results in a new thermodynamic minimum for the system, the exfoliation and spreading of boron nitride at a water/heptane interface was studied. When BN powder is placed in a clean glass vial, the BN was observed to reside at the heptane/water interface. After low power bath sonication for 30 seconds, the BN spreads at the interface and also climbs the wall of the vial as it stabilizes the interface between the layer of water on the hydrophilic glass and the heptane vapor as shown in FIG. 1C. More importantly, the BN was also observed to spread and climb the glass vial wall without the use of sonication, although at a significantly slower rate. This is illustrated in FIG. 1E, and the initial mixture is shown in FIG. 1D. This behavior is analogous to that observed for graphite in previous studies.

Figure 2A:
FIG. 2A shows an image of a boron nitride film on a glass microscope slide (Boron nitride nanosheets prepared on a glass slide by interfacial trapping technique).
Figure 2B:
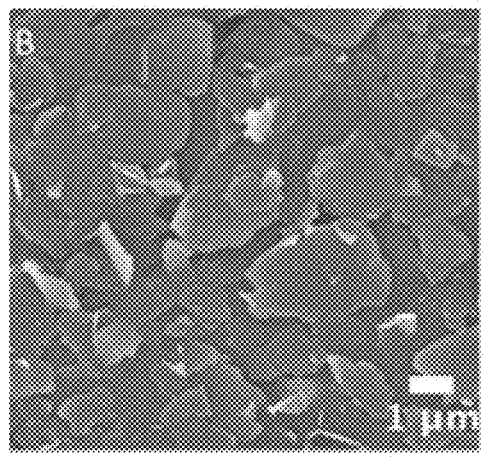
FIG. 2B shows a SEM image of a boron nitride film showing individual sheets.
Figure 2C:
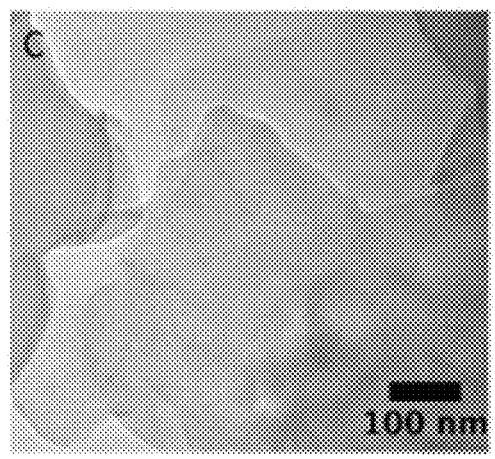
FIG. 2C shows a TEM image of film demonstrating the film to be composed of several overlapping sheets.

Since the BN sheets spread at the water wet hydrophilic glass surfaces of a vial that are in contact with an oil phase, they also climb the surface of glass slides placed in a vial. FIG. 2A shows such a glass slide covered with a BN film. These films consisted of overlapping sheets of BN as illustrated by the SEM image shown in FIG. 2B, where the sheets comprising the film are clearly visible and have lateral dimensions of several microns. The degree of TEM contrast in FIG. 2C suggests that the film consists of overlapping BN sheets. Regions with no sheets, one sheet, and two to three sheets are apparent, with approximately 10% of the surface containing no sheets. The presence of single layer BN sheets in the film is also confirmed by the peak at 1369 cm$^{-1}$ in the Raman spectra shown FIG. 5. Additionally, electron diffraction patterns reveal the typical six-fold symmetry structure of BN sheets, as shown/discussed in Example 1 below.

Figure 11A:
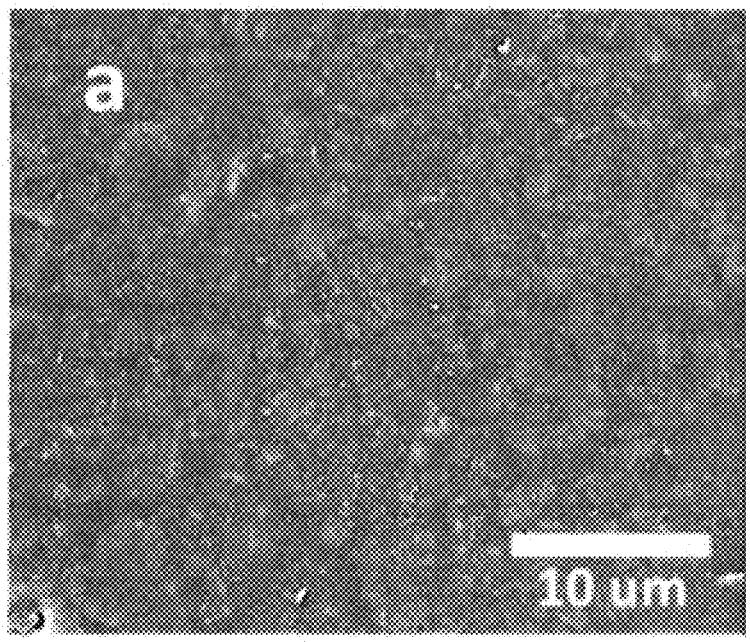
FIGS. 11A-11B show SEM images of the few-layer BN coated PMMA film, and showing the same region before (FIG. 11A) and after (FIG. 11B) intense electron beam treatment, demonstrating that the sheets are at the polymer film surface.
Figure 11B:
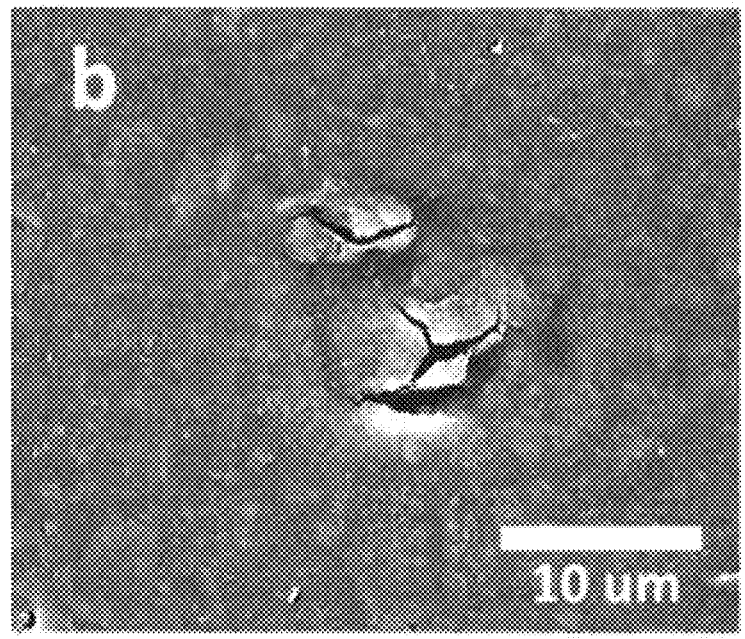

The overlapping BN sheets on the glass slide are transferred to a polymer surface by drop casting a polymer solution onto the dried BN film. This procedure is presented in FIG. 3. A solution of PMMA in tetrahydrofuran (THF) is placed on the BN film and allowed to dry. FIG. 4A shows a BN film covered with a layer of PMMA before it is peeled off the slide. The BN film is embedded on the surface of the polymer as illustrated by the SEM image in FIG. 4B, where the outline of flat BN sheets covered by polymer can be clearly seen. To confirm that a thin layer of polymer resides on top of the BN sheets, the electron beam of the SEM is focused on a small area as shown in FIGS. 11A-11B. After exposure for less than a minute, the covering polymer layer degrades, revealing the embedded BN sheets just below the surface.

In order to investigate the role played by the overlapping BN sheet morphology, as opposed to a possible bulk effect of BN, a control polymer film was prepared containing a mass of BN equal that found in the BN film, but without the continuous film morphology. To do this, a PMMA film with a BN coating was dissolved in THF, and then re-cast onto a glass slide followed by THF evaporation. This procedure removed the exfoliated BN film morphology and made a PMMA film with BN sheets randomly dispersed, and possibly re-stacked, within it. The properties of the three samples were then compared: the BN coated polymer films, neat PMMA films, and PMMA films containing BN but lacking the overlapping sheet morphology.

Figure 4A:
FIG. 4A shows a photograph of PMMA film coated with BN.
Figure 4B:
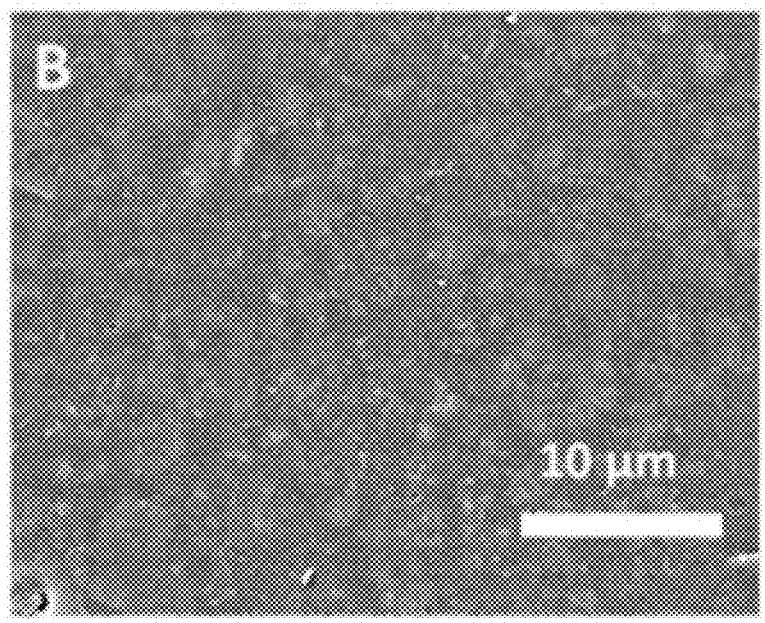
FIG. 4B shows a SEM image of BN coating on PMMA film, showing the BN sheets imbedded in the polymer.
Figure 4C:
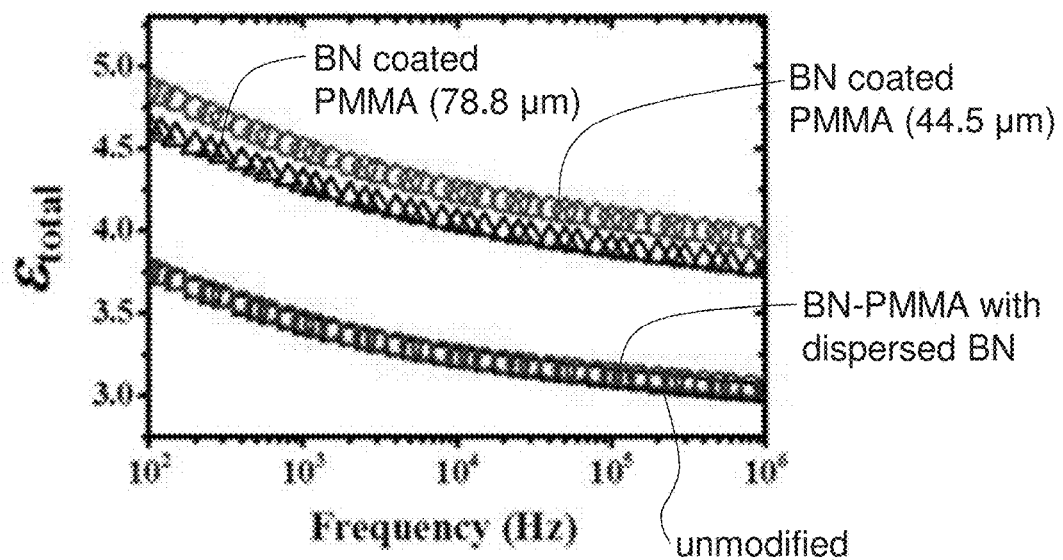
FIG. 4C shows the dielectric constant at room temperature as a function of frequency for unmodified PMMA film (squares, lower curve), BN-PMMA film with dispersed BN sheets (circles overlaying squares), and BN coated PMMA film with thickness 78.8 μm (triangles), 44.5 μm (pentagons).
Figure 4D:
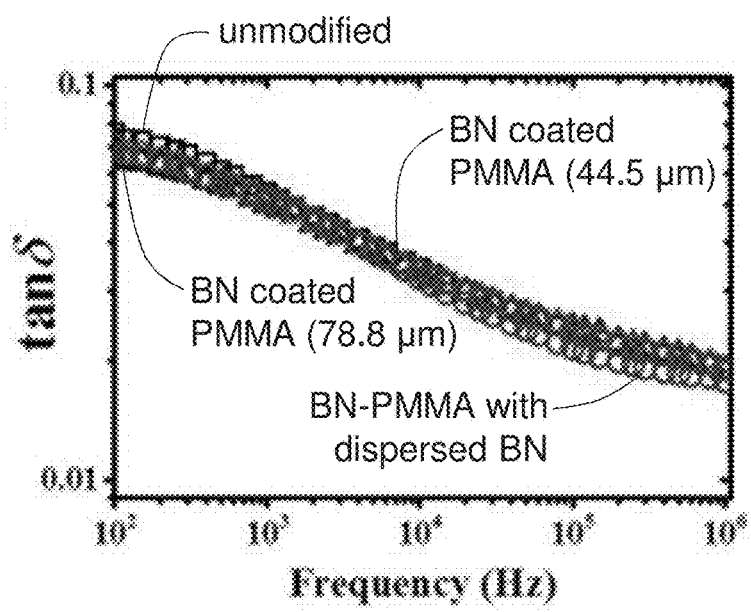
FIG. 4D shows the loss ratio as a function of frequency (curves have the same identity as in FIG. 4C).
Figure 12:
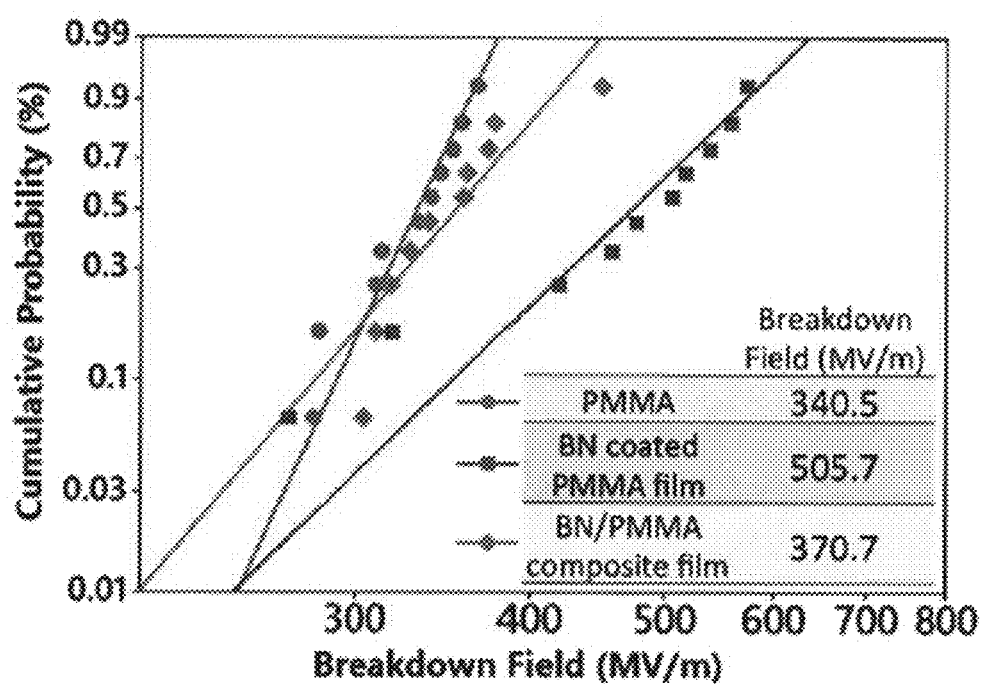
FIG. 12 shows the Weibull distribution for BN coated PMMA, neat PMMA film and BN/PMMA composite film at room temperature.

The PMMA coated with a BN film shows a significant increase in dielectric constant as compared to both the neat PMMA films and the PMMA films filled with randomly oriented BN sheets (see FIG. 4C). Additionally, the loss ratio of coated PMMA is not affected by the BN sheets, as might be expected for such a low loading (less than 0.01% by mass) (FIG. 4D). The significant improvement of the dielectric properties of the thin layer BN coated polymer film is attributed to the presence of the continuous overlapping BN sheets that constitute the thin BN layer. It was observed that the dielectric properties of the thinner polymer films are better in comparison with thicker samples. For thinner samples, the contribution of the BN layer to the total film's dielectric properties is proportionally greater. Note that this change in film dielectric properties is consistent with a recent study of a BN/graphene nanocapacitor in which a significant increase (from 4.9 to as high as 12) of the dielectric constant of BN sheets was observed as the number of layers decreased from 16 to 2. See, e.g., Shi et al., Nano Lett. 2014, 14 (4), 1739-1744. It was also observed, in addition to improvements in the dielectric constant, that the breakdown field of the few-layer BN coated PMMA film increases by approximately 50% from 340.5 MV/m for pure PMMA to 505.7 MV/m, as determined using a linear voltage ramp and the Weibull distribution, as shown in FIG. 12. Using the value of the dielectric constant at 1 kHz and the breakdown field, the energy density was calculated, using the formula $\varepsilon\varepsilon_0 E^2/2$ (where $\varepsilon_0=8.85\times10^{-12}$ F/m is the dielectric permittivity of the vacuum), for BN coated PMMA film to be 4.85 J/cm$^3$. Thus, the presence of the BN layer has the potential to increase the stored energy density by 2.76 times in comparison with that for pure PMMA. Note that this value of the stored energy is greater than that for the state-of-the-art biaxially oriented polypropylene film capacitor. See, e.g., Chu et al., Science 2006, 313 (5785), 334-336.

The BN film coating, in addition to improving the electrical properties of the polymer film, also improves the polymer's barrier properties. Without the BN coating, PMMA obtained by drop casting from a THF solution allowed the permeation of gas at the rate of $2.347\times10^{-14}$ cm$^3$ cm/cm$^2$ s Pa. The presence of the BN layer, even though less than four sheets thick and with approximately 10% uncovered area, resulted in a decrease of the gas permeation to $2.845\times10^{-14}$ cm$^3$ cm/cm$^2$ s Pa. This is nearly a 21% change with a loading of less than 0.01%. The presence of a near continuous coating of the polymer with overlapping BN sheets is a very plausible explanation for such a large effect from such a small loading.

In this disclosure, it has been demonstrated that the surface activity of BN sheets for water/oil interfaces, and one can utilize the spreading driven by this surface activity for the preparation of films consisting of few-layer overlapping BN sheets. Using molecular dynamics simulations, the mechanism of BN sheet spreading has been explained, and it has been shown that this spreading is driven by the minimization of the system free energy. BN films produced by the sheets' spreading were coated onto polymer films, resulting in significant alterations in the properties of the films at extremely low loadings of the overlapping BN sheets. These property changes included increases in the dielectric constant and the breakdown electric field, and decreases in gas permeation. The inexpensive and straightforward formation and application of these BN based composite films, coupled with their significant property enhancements, make them a promising material, with a low barrier of entry, for applications in electronics and energy storage, among other applications.

The present disclosure will be further described with respect to the following examples; however, the scope of the disclosure is not limited thereby. The following examples illustrate the advantageous systems/methods of the present disclosure of fabricating improved composite films and the like.

EXAMPLE 1

This Example discusses experimental procedures, details of BNNS thin films and BN coated polymer sample preparation, films characterizations, and details of the computational study.

BN Film Preparation:

Hexagonal boron nitride powder (UK Abrasives, Inc.), n-heptane (Alfa Aesar), tetrahydrofuran (Fisher Chemical), HPLC grade chloroform (Fisher Chemical), and 540 kg/mole poly(methyl methacrylate) (Scientific Polymer Products, Inc.) were used as received.

The following procedure to prepare few-layer BN sheets films was typical: 2 mg of hBN was put into a 20 ml scintillation vial; 5 ml heptane and 5 ml DI water were then added, and the system bath sonicated for 15 seconds to break up large particles. Tip sonication was then used for 15 minutes at 40% power. The vial was then gently shaken and a continuous white film was observed on the wall of the glass vial, and a glass slide was put into the vial. After the glass slide was coated by BN sheets, it was taken out and dried at about 70° C.

Film Structure Characterizations:

FESEM measurements were performed using a JEOL JSM-6335F cold cathode field emission (12 kV) scanning electron microscope. TEM samples were prepared on a carbon grid by a floating off method described in Woltornist et al., *ACS Nano* 2013, 7 (8), 7062-66, followed by viewing in both transmission and diffraction mode on a FEI Tecnai T12 STEM. Raman spectra were obtained by a Renishaw Ranascope System 2000 operating at 514 nm. Thermogravimetric analysis (TGA) was carried out on a TA Instruments Q 500 at a heating rate of 10° C. min$^{-1}$ in a platinum pan.

Simulation Details:

Molecular dynamics simulations were used to model the affinity of a hexagonal Boron Nitride (BN) sheet and stacks of sheets to a water/heptane interface. The total potential energy of the system included the bond, bond angle, dihedral angle, improper angle and non-bonded interaction potentials.

$$U_{Total} = \sum_{BONDS} K_r(r-r_0)^2 + \sum_{ANGLES} K_\theta(\theta-\theta_0)^2 + \sum_{DIHEDRALS} K_{dih}[1+d\cos(n\phi)] + \sum_{IMPROPERS} K_{impr}[1+d\cos(m\varphi)] + \sum_{i<j}\left[\frac{A_{ij}}{R_{ij}^{12}} - \frac{B_{ij}}{R_{ij}^6} + \frac{q_i q_j}{\varepsilon R_{ij}}\right] \quad \text{(Equation 1)}$$

Figure 7A:
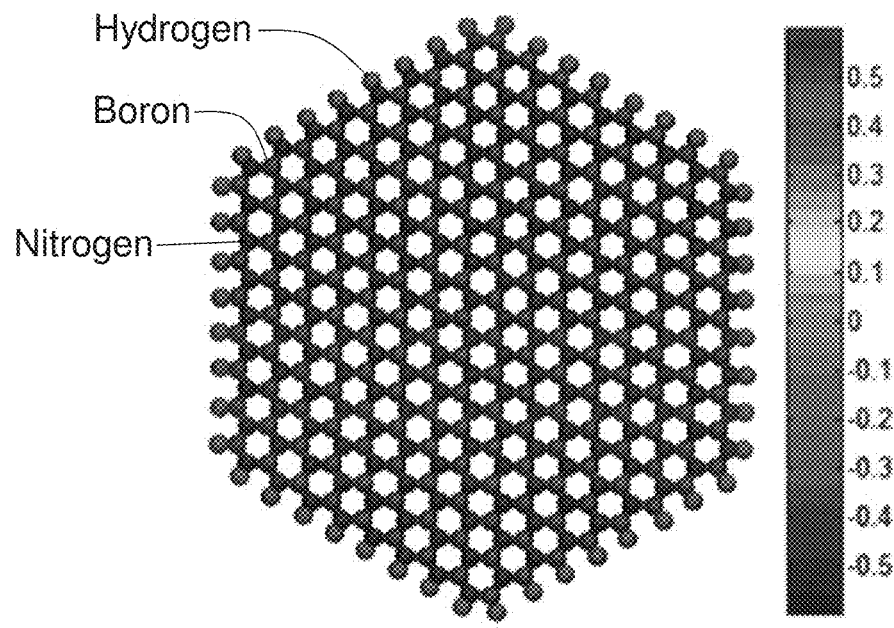
FIG. 7A shows the structure of a cyclic $B_{192}N_{192}H_{48}$ molecule.

The interaction parameters for the van der Waals potentials between heterogeneous atomic pairs were calculated as the geometric mean of the interaction parameters for each atom. The default AMBER force field weighing coefficients for pair-wise energy and force contributions were used to account for the contribution from the van der Waals and electrostatic interactions. The BN sheets were modeled by a cyclic $B_{192}N_{192}H_{48}$ molecules consisting of eight generations (G8) of boron-nitride rings terminated by the hydrogens (see FIGS. 7A-7B).

Figure 7B:
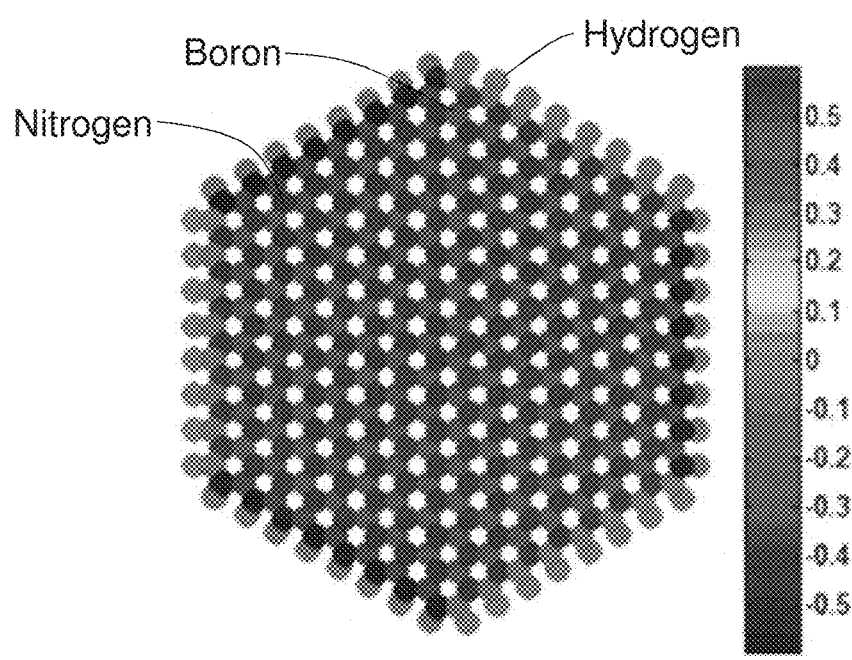
FIG. 7B shows the partial charge distribution of a cyclic $B_{192}N_{192}H_{48}$ molecule obtained from DFT calculations.

In the simulations the Generalized Amber Force Field (GAFF) parameters for heptane, and TIP3P force field potentials for water were utilized. See, e.g., Wang et al., *Journal of Computational Chemistry* 2004, 25 (9), 1157-74; and see Price et al., *The Journal of Chemical Physics* 2004, 121 (20), 10096-10103. The force field parameters of BN sheets were obtained from DFT calculations (see "Calculations of Force Field Parameters for BN" below for details). The results of these calculations are summarized below in Table 1. The Mulliken partial charge distribution for BN is shown in FIG. 7B, and heptane were obtained from ab-initio calculations using Gaussian 09 simulation package with 6-31G(d) basis set and B3LYP DFT method without geometry optimization. See, e.g., Frisch et al., *Gaussian 09*, Gaussian, Inc.: Wallingford, Conn., USA, 2009.

TABLE 1

Force Field Parameters of the BN Sheet

| | | |
|---|---|---|
| Bonded Potential [kcal/mol/Å$^2$] | B—N | 280.5 |
| | B—H | 236.8 |
| | N—H | 371.5 |
| Bond Length r$_0$ [Å] | B—N | 1.436 |
| | B—H | 1.20 |
| | N—H | 1.01 |

TABLE 1-continued

Force Field Parameters of the BN Sheet

| | | |
|---|---|---|
| Angle Potential [kcal/mol/rad$^2$] | B—N—B | 96.02 |
| | N—B—N | 41.03 |
| | B—N—H | 31.14 |
| | N—B—H | 36.57 |
| Bond Angle θ$_0$ [rad] | all | 2π/3 |
| Dihedral Potential [kcal/mol] | B—N (dihedral structure) | 1.0632 |
| Dihedral Coeff | d | −1 |
| | n | 2 |
| Improper Potential [kcal/mol] | B–N(–B)–B | 1.778 |
| | N–B(–N)–N | 112.05 |
| Improper Coeff | d | −1 |
| | m | 1 |
| Non-bonded Potential[3] | σ$_{B-B}$ | 3.453 Å |
| | ε$_{B-B}$ | 0.0949 kcal/mol |
| | σ$_{N-N}$ | 3.365 Å |
| | ε$_{N-N}$ | 0.1448 kcal/mol |
| | σ$_{H-H}$ | 2.813 Å |
| | ε$_{H-H}$ | 0.0163 kcal/mol |

The molecular dynamics simulations were performed using LAMMPS. See, e.g., Plimpton, S., *Journal of Computational Physics* 1995, 117 (1), 1-19. System dimensions, number of atoms, and number of BN sheets used in the simulations are listed in Table 2 below. 3-D periodic boundary conditions were utilized. The atoms' equations of motion were integrated by using the velocity Verlet algorithm with a time step of 1.0 fs. The standard PPPM method with accuracy of 10$^{-5}$ and near field cutoff set to 10.0 Å was used to account for the long-range electrostatic interactions. See, e.g., Hockney et al., *Computer simulation using particles*, CRC Press: 1988. The simulations began with placing BN sheets at the interface between two solvents. The systems were equilibrated performing NPT ensemble simulations lasting 3.25 ns. A Nose-Hoover thermostat and barostat with relaxation times of 0.1 ps and 1.0 ps, respectively, were used to maintain the systems' temperature T=300 K and pressure P=1 atm. During the first 0.25 ns of the equilibration runs the locations of atoms belonging to BN sheets were fixed. Then all constrains were removed and the simulation runs were continued for 3.0 ns allowing systems to equilibrate. Following the NPT simulations, NVT production runs with duration 3.0 ns were performed.

TABLE 2

Systems' Information

| System | L$_x$ [Å] | L$_y$ [Å] | L$_z$ [Å] | # BN Sheets | # Water Molecules | #Heptane Molecules | Total Number of Atoms |
|---|---|---|---|---|---|---|---|
| Number | 92.10 | 90.40 | 82.25 | 1 | 10800 | 1360 | 64112 |
| Fraction | 92.10 | 90.40 | 83.22 | 4 | 10800 | 1360 | 65408 |
| Calculations | 138.1 | 127.6 | 83.38 | 9 | 22800 | 2880 | 138528 |
| PMF Calculations | 92.10 | 90.40 | 109.8 | 1 | 10800 | 2253 | 84651 |

In order to evaluate the affinity of the BN sheets to the water/heptane interface one can calculate the potential of the mean force using the Weighted Histogram Analysis Method (WHAM) for interactions between a single BN sheet and the water/heptane interface. See, e.g., Kumar et al., *Journal of Computational Chemistry* 1995, 16 (11), 1339-50. The simulations were performed in a NVT ensemble. The constant temperature was maintained by coupling a system of Nose-Hoover thermostat with relaxation time of 0.1 ps.

For simulations of a single sheet system, the initial BN sheet configuration was selected from NVT simulations of the single BN sheet at the water/heptane interface. The z-coordinate of the center of mass of the BN sheet, $z_{cm}^{BN}$, was tethered at point z* by a harmonic spring:

$$U_{spring}(z_{cm}^{BN}, z^*) = \frac{K_{spring}}{2}(z_{cm}^{BN}, z^*)^2 \quad \text{(Equation 2)}$$

with the value of the spring constant K$_{spring}$=250 kcal/(mol Å$^2$). To prevent the solvent interface from moving with the BN sheet we have tethered the z-coordinate of the center of mass of all water molecules $z_{cm}^w$ at their initial location, $z_0^w$. The value of the tethering spring constant was set to K$_{spring}$=750 kcal/(mol Å$^2$). The location of the tethering point z* of the BN sheet was displaced with an increment Δz*=±0.1 Å until z*=±5.0 Å was reached in heptane and water phases, respectively. For each location of the tethering point, the system was equilibrated for 0.1 ns. Each equilibration run was followed by a production run lasting 0.3 ns, during which the distribution of the center of mass of the BN sheet was collected for WHAM calculations of the potential of mean force.

Calculations of Force Field Parameters for BN:

The force field parameters for bond, bond angle, dihedral angle and improper angle potentials used in the molecular dynamics simulations of the BN sheets were obtained from ab-initio calculations of the in plane and out of plane displacements of boron, nitrogen and hydrogen atoms using B3LYP DFT simulations with 6-31G(d) basis set. Each BN molecule has three types of bonds B—N, B—H and N—H; four types of bond angles B—N—B, N—B—N, B—N—H and N—B—H; one type of dihedral angle

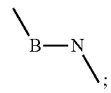

and two types of improper angles

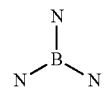 (B-NNN)

and

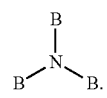 (N-BBB)

Note that to minimize the edge effect on the BN sheet rigidity the values of the parameters for dihedral angles and improper angle potentials which include hydrogen atoms were set to be equivalent to the values for boron and nitrogen in the sheet center. Infinitesimally small displacements of atoms in the vicinity of their equilibrium locations results in variation of the bond lengths, bond angles, dihedral angles or improper angles. For such displacements the total potential energy change is a quadratic function of the displacement. Using independent modes of atom motion one can relate the changes of the system potential energy obtained from the DFT calculations to that expressed in terms of variations of the bond lengths, bond angles, dihedral angles and improper angles as given by Equation 1 and obtain corresponding values for $K_r$, $K_\theta$, $K_{dih}$, and $K_{imp}$.

Figure 8A:
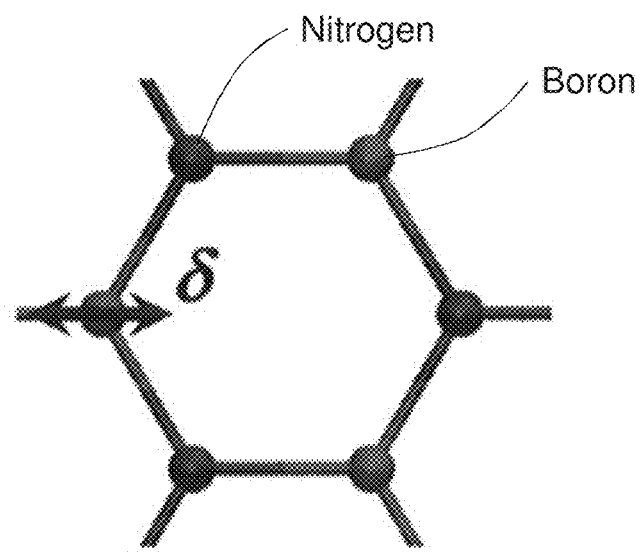
FIGS. 8A-8C show modes of the in-plane displacement of the boron and nitrogen atoms in the BN sheet.
Figure 8B:
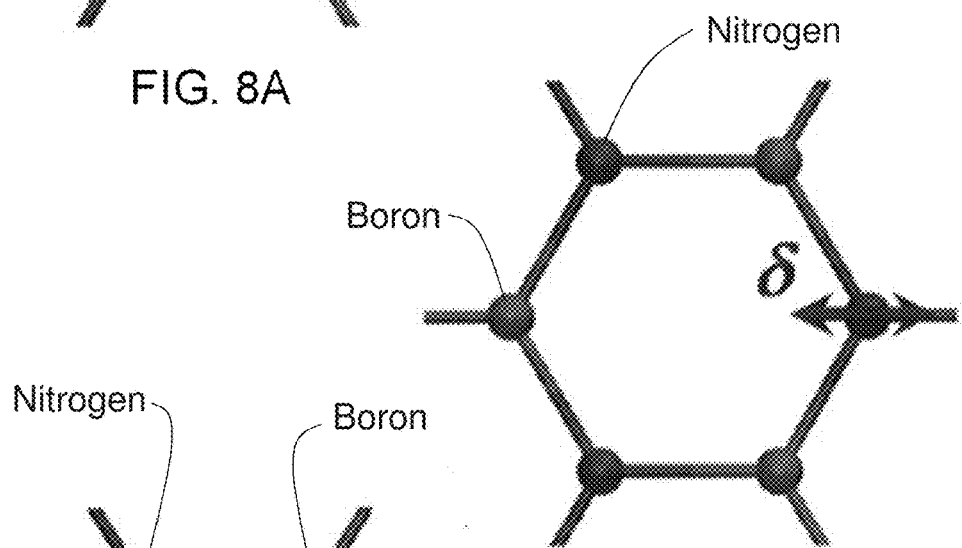
Figure 8C:
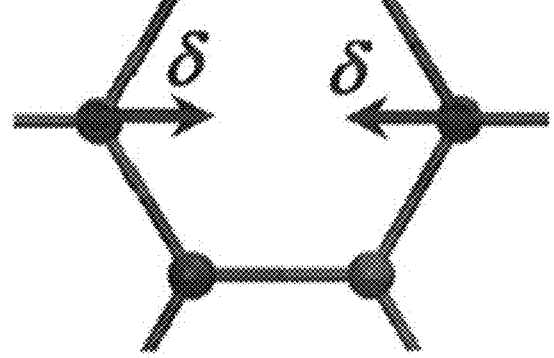
Figure 9A:
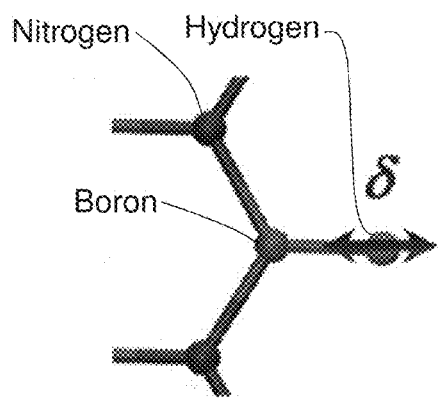
FIGS. 9A-9D show the modes of in-plane displacement of hydrogen atom.
Figure 9B:
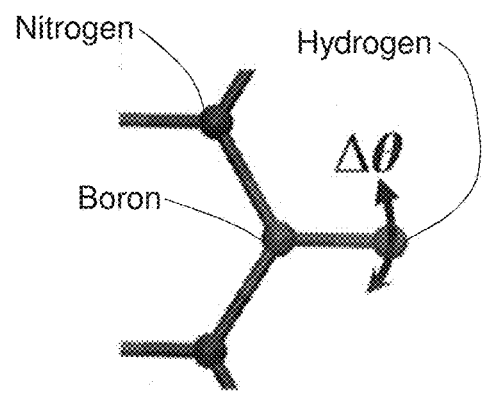
Figure 9C:
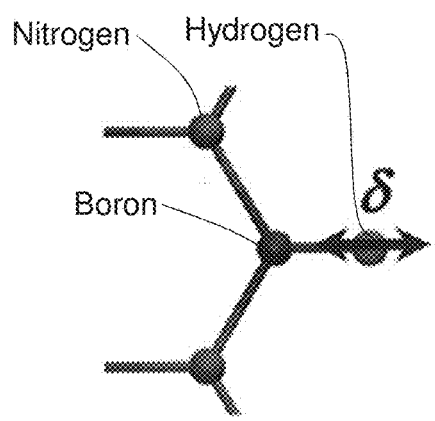
Figure 9D:
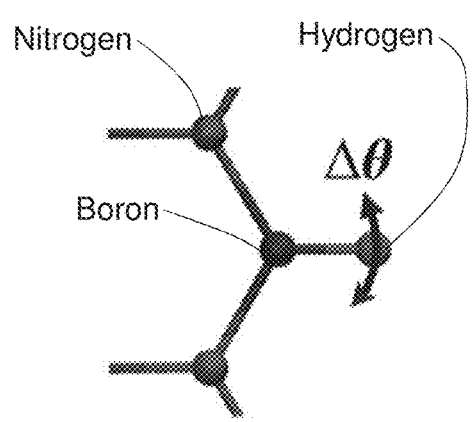
Figure 10A:
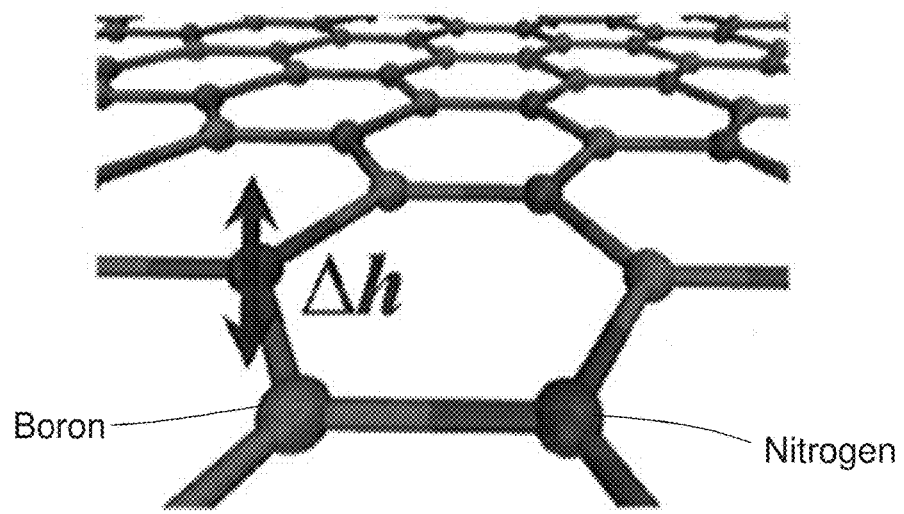
FIGS. 10A-10D show the modes of out-of-plane deformations of the hBN sheet.
Figure 10B:
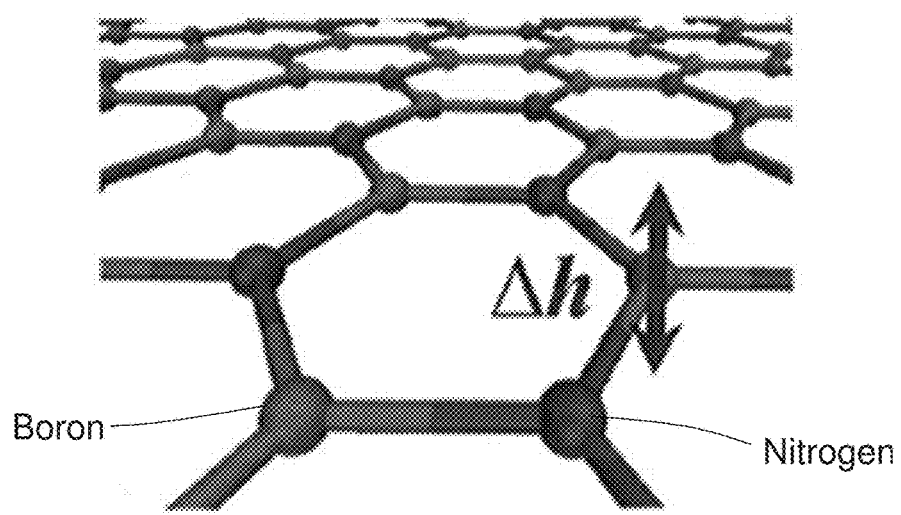
Figure 10C:
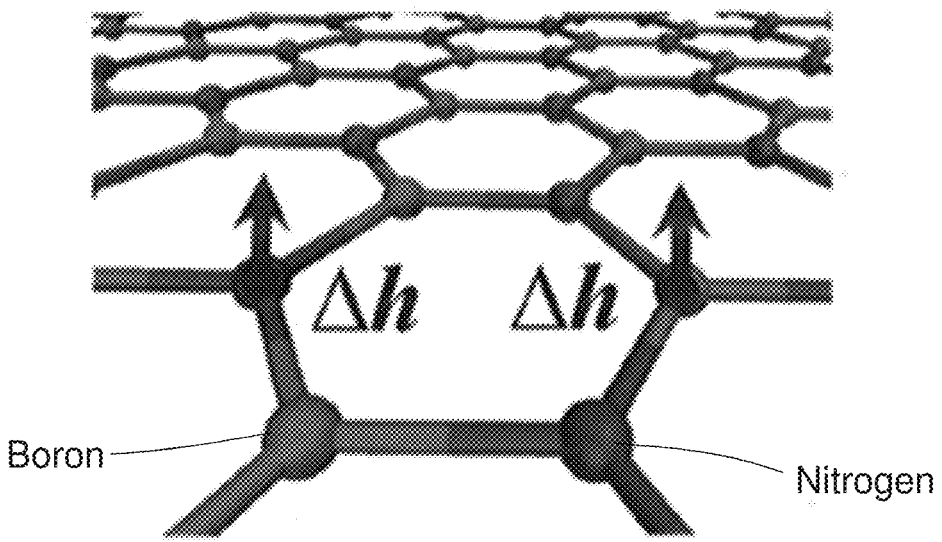
Figure 10D:
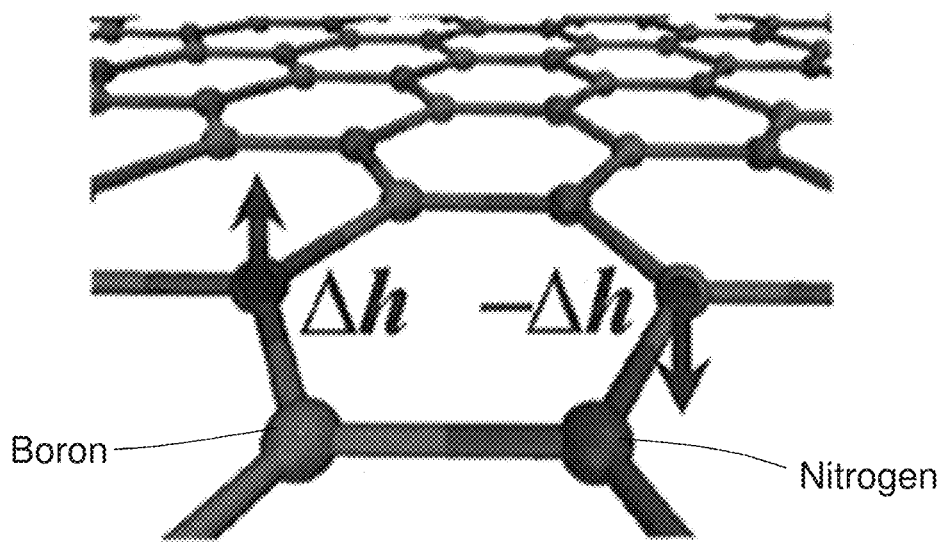

Bond and Bond Angle Potential Parameters:

For in-plane deformation modes shown in FIGS. 8A-8C, the total system energy change includes changes associated with the bond and bond angle contributions into the potential energy.

$$\Delta U_{IN} = \sum_{BONDS} K_r(r-r_0)^2 + \sum_{ANGLES} K_\theta(\theta-\theta_0)^2 \quad \text{(Equation 3)}$$

For displacement of a boron atom by a distance $\delta$ as shown in FIG. 8A, one can express changes in the bond lengths $\Delta r$ and variations in the bond angles $\Delta\theta$ in terms of the displacement $\delta$ and equilibrium bond length $r_0$. Expanding Equation 3 in the power series for small $\delta$ and keeping only quadratic terms the following is obtained:

$$\Delta U_B = \frac{3}{2}K_r\delta^2 + \frac{9}{2r_0^2}K_\theta^{NBN}\delta^2 + \frac{3}{r_0^2}K_\theta^{BNB}\delta^2 \quad \text{(Equation 4)}$$

where $K_\theta^{NBN}$ is the spring constant of N—B—N bond angle and $K_\theta^{BNB}$ is the spring constant of the B—N—B bond angle. Repeating the same calculations for displacement of the nitrogen atom (see FIG. 8B) and for the boron and the nitrogen in 1,4 position on the hexagonal ring (see FIG. 8C) we can rewrite Equation 3 as follows:

$$\Delta U_N = \frac{3}{2}K_r\delta^2 + \frac{9}{2r_0^2}K_\theta^{BNB}\delta^2 + \frac{3}{r_0^2}K_\theta^{NBN}\delta^2 \quad \text{(Equation 5)}$$

$$\Delta U_{BN} = 5K_r\delta^2 + \frac{15}{2r_0^2}(K_\theta^{BNB} + K_\theta^{NBN})\delta^2 \quad \text{(Equation 6)}$$

Solving Equation 4, Equation 5 and Equation 6, we obtain:

$$\begin{cases} K_r = \frac{1}{2}(K_{BN} - K_B - K_N) \\ K_\theta^{BNB} = \frac{r_0^2}{2}\left(K_N - \frac{1}{3}K_B - \frac{1}{5}K_{BN}\right) \\ K_\theta^{NBN} = \frac{r_0^2}{2}\left(K_B - \frac{1}{3}K_N - \frac{1}{5}K_{BN}\right) \end{cases} \quad \text{(Equation 7)}$$

where $K_{BN}=\Delta U_{BN}/\delta^2$, $K_N=\Delta U_N/\delta^2$, and $K_B=\Delta U_B/\delta^2$ are effective spring constants obtained from fitting results of the DFT calculations of the G8 BN sheet total energy changes as a function of displacement $\delta$ (see Table 3 below).

The BN sheet is terminated by hydrogen atoms at the edge. Therefore, motion of the hydrogen atom can be reduced to the deformation of either the bond length or bond angle as shown in FIG. 9.

Dihedral and Improper Angle Potential Parameters:

For out-of-plane displacement of the boron and nitrogen atoms as shown in FIGS. 10A-10D, the total system energy change includes contributions from dihedral and improper angle potentials:

$$\Delta U_{OUT} = \sum_{DIHEDRALS} K_{dih}[1 + d\cos(n\phi)] + \sum_{IMPROPERS} K_{impr}[1 + d\cos(m\varphi)] \quad \text{(Equation 8)}$$

where $d=-1.0$, $n=2.0$, and $m=1.0$. One can express changes in the dihedral and improper angles in terms of the out-of-plane displacement $\Delta h$ and expand Equation 8 in a power series of $\Delta h$ up to quadratic terms. It is important to point out that the contributions to the BN sheet potential energy due to changes in the bond lengths and bond angles start with $\Delta h^4$ terms and can be neglected. For displacement of the boron and nitrogen atoms shown in FIGS. 10A and 10B, the variation of the energy of the G8 BN sheet as a function of the displacement $\Delta h$ can written as follows:

$$\Delta U_B = \frac{112}{r_0^2}K_{dih}\Delta h^2 + \frac{2}{r_0^2}K_{imp}^{BNNN}\Delta h^2 + \frac{2}{3r_0^2}K_{imp}^{NBBB}\Delta h^2 \quad \text{(Equation 9)}$$

$$\Delta U_N = \frac{112}{r_0^2}K_{dih}\Delta h^2 + \frac{2}{r_0^2}K_{imp}^{NBBB}\Delta h^2 + \frac{2}{3r_0^2}K_{imp}^{BNNN}\Delta h^2 \quad \text{(Equation 10)}$$

Repeating the same calculations for displacement of the boron and nitrogen atoms in the same, Sd, (see FIG. 10C) and in the opposite, Od, (see FIG. 10D), directions located in 1,4 positions on the same hexagonal ring the variation of the total potential energy as a function of displacement $\Delta h$ can be written as follows:

$$\Delta U_{BN}^{Sd} = \frac{640}{3r_0^2}K_{dih}\Delta h^2 + \frac{8}{3r_0^2}K_{imp}^{BNNN}\Delta h^2 + \frac{8}{3r_0^2}K_{imp}^{NBBB}\Delta h^2 \quad \text{(Equation 11)}$$

-continued $$\Delta U_{BN}^{Od} = \frac{704}{3r_0^2}K_{dih}\Delta h^2 + \frac{8}{3r_0^2}K_{imp}^{BNNN}\Delta h^2 + \frac{8}{3r_0^2}K_{imp}^{NBBB}\Delta h^2 \quad \text{(Equation 12)}$$

Solving together Equation 9, Equation 10 and Equation 11, one obtains:

$$\begin{cases} K_{dih} = \frac{r_0^2}{32}\left(2K_{BN}^{Sd} - K_B - K_N\right) \\ K_{imp}^{NBBB} = \frac{3r_0^2}{8}\left(5K_N + 3K_B - 7K_{BN}^{Sd}\right) \\ K_{imp}^{BNNN} = \frac{3r_0^2}{8}\left(5K_B - 3K_N - 7K_{BN}^{Sd}\right) \end{cases} \quad \text{(Equation 13)}$$

where one can introduce $K_{BN}^{Sd} = \Delta U_{BN}^{Sd}/\Delta h^2$, $K_N = \Delta U_N/\Delta h^2$, and $K_B = \Delta U_B/\Delta h^2$ (see Table 3 for corresponding values). Note that one can also use Equation 9, Equation 10 and Equation 12 to find force field parameters. The fitting results are summarized in Table 3 below.

TABLE 3

Values of constants $K_i$ obtained from DFT calculations of G8 BN Mode [kcal/mol/Å²]

| | | |
|---|---|---|
| in-plane | $K_B$ | 644 |
| | $K_N$ | 706 |
| | $K_{BN}$ | 1930 |
| out-of-plane | $K_B$ | 167.0 |
| | $K_N$ | 95.7 |
| | $K_{BN}^{Sd}$ | 257.2 |
| | $K_{BN}^{Od}$ | 268.2 |

Polymer Coated BN Film Preparation:

To prepare BN coated poly(methyl methacrylate) (PMMA) film, 0.05 g/ml PMMA in tetrahydrofuran (THF) solution was drop casted on the BN covered glass slide. After the THF evaporated, the BN coated PMMA film was first dried at 50° C. overnight, then could be peeled off from the glass slide with care. Contacting the film without damaging the surface did not affect the BN sheets network in it.

Dielectric Properties:

Dielectric spectroscopies were obtained using an Agilent 4284A Precision LCR meter averaging 5 measurements of the capacitance and dissipation over a frequency range between 100 Hz and 1 MHz. Breakdown strength measurements were performed using a linear voltage ramp generated by a resistor capacitor (RC) circuit. When the first breakdown event occurs, the power supply was shut off through an interlock input by a silicon controlled rectifier (SCR) circuit, which used the breakdown-induced ground-rise voltage capacitively coupled to the gate of an SCR. The breakdown voltage of the sample was read from a peak-holding voltmeter. The sample thickness was determined using a thickness gauge (Model LE1000-2, MeasureItAll) as the average of several measurements near the breakdown site.

Figure 13A:
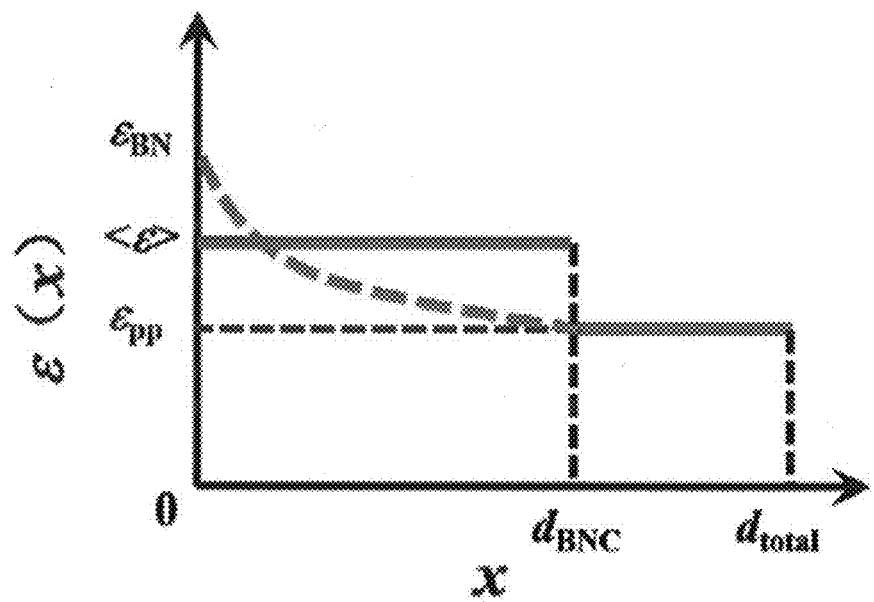
FIG. 13A is a schematic representation of variation of the dielectric constant ε(x) across film thickness, $d_{total}$.
Figure 13B:
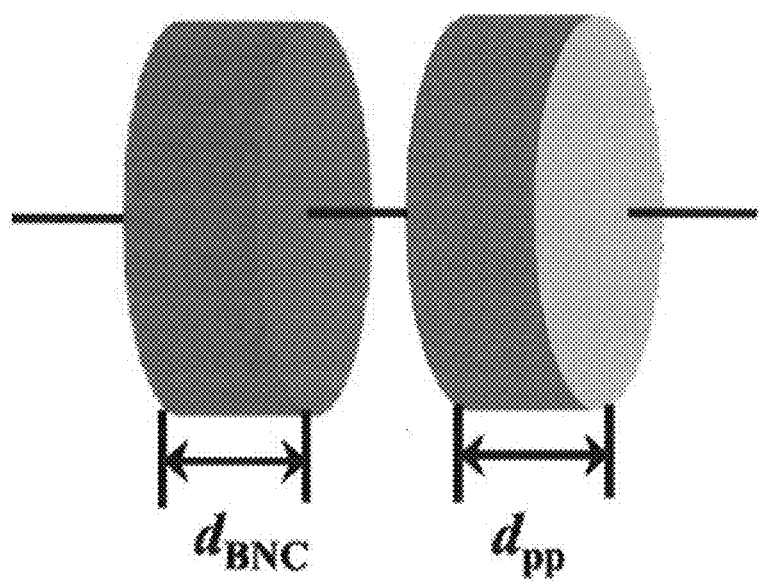
FIG. 13B is a schematic representation of BN/PMMA film as two capacitors connected in series.

In order to describe the significant increase in the dielectric constant of the PMMA coated BN film, one can assume a two-layer structure (shown in FIGS. 13A-13B): the first layer is a BN/polymer composite layer, within which the dielectric properties of the film are influenced by the presence of the BN film, with dielectric constant $\varepsilon(x)$ and thickness $d_{BNC}$, and the second layer consists of pure polymer with dielectric constant $\varepsilon_{pp}$ and thickness $d_{pp} = d_{total} - d_{BNC}$. In the framework of this model the total capacitance of the BN coated film can be described as two capacitors connected in series:

$$\frac{1}{C_{total}} = \frac{1}{C_{BNC}} + \frac{1}{C_{pp}} \quad \text{(Equation 14)}$$

Using the expression for the parallel plate capacitor with area A and thickness between plates d, $C = \varepsilon_0\varepsilon A/d$, one can rewrite Equation 14 as follows:

$$\frac{d_{total}}{\varepsilon_{total}} = \int_0^{d_{BNC}} \frac{dx}{\varepsilon(x)} + \frac{d_{pp}}{\varepsilon_{pp}} = \frac{d_{BNC}}{\langle\varepsilon\rangle} + \frac{d_{pp}}{\varepsilon_{pp}} \quad \text{(Equation 15)}$$

where one can introduce the average dielectric constant of the composite layer $$\langle\varepsilon\rangle^{-1} = d_{BNC}^{-1}\int_0^{d_{BNC}} dx/\varepsilon(x).$$

Taking into account that $d_{pp} = d_{total} - d_{BNC}$, Equation 15 can be written as follows:

$$d_{total}\left(1 - \frac{\varepsilon_{pp}}{\varepsilon_{total}}\right) = d_{BNC}\left(1 - \frac{\varepsilon_{pp}}{\langle\varepsilon\rangle}\right) \quad \text{(Equation 16)}$$

Figure 14A:
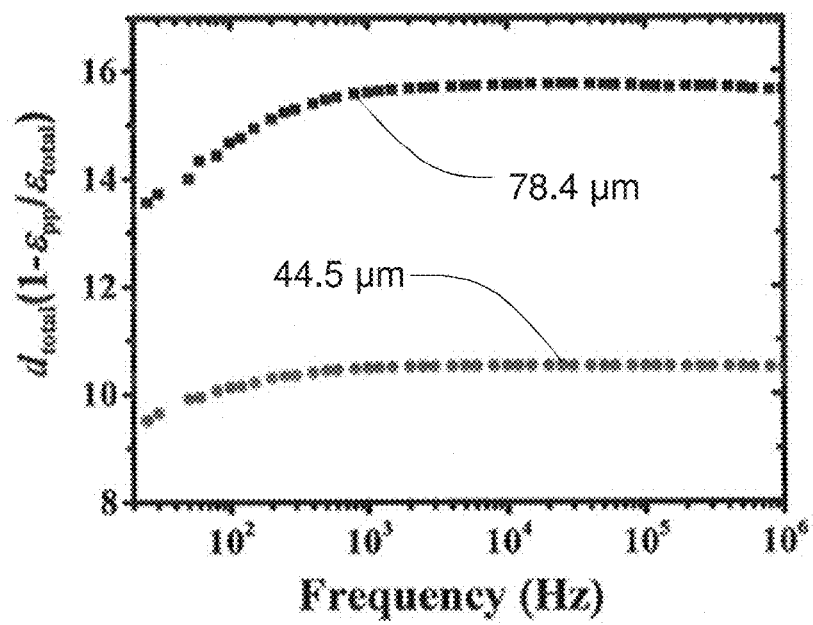
FIGS. 14A-14B show the dependence of parameter $d_{total}$ $(1-\varepsilon_{pp}/\varepsilon_{total})$ on frequency (FIG. 14A) and dielectric constant of the polymer layer $\varepsilon_{pp}$ (FIG. 14B) for the BN coated films with thickness $d_{total}$=78.4 μm and $d_{total}$=44.5 μm. Dash lines correspond to fitting results by using Equation 16 in the frequency range below 1 kHz.
Figure 14B:
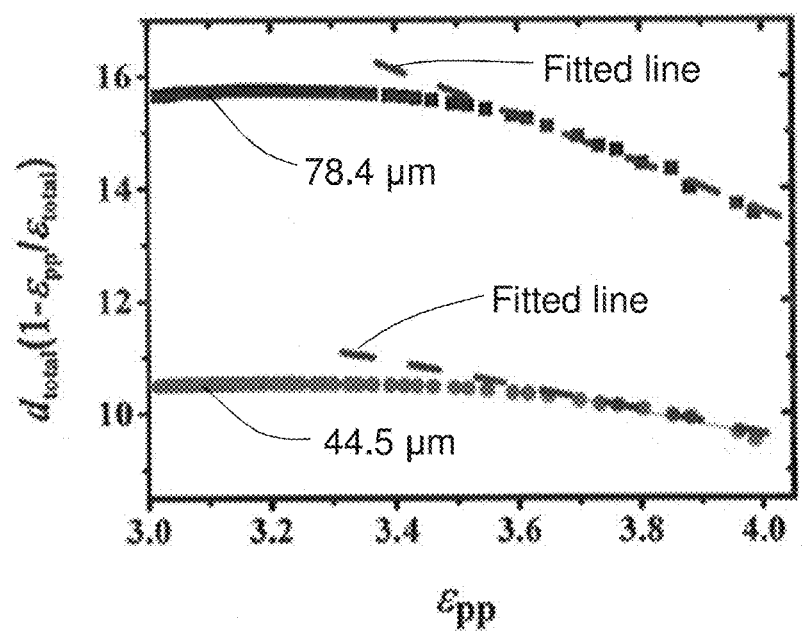

FIG. 14A shows dependence of the lhs of the Equation 16 on frequency. It follows from FIG. 14A that for the frequency range above 1 kHz, the ratio of $\varepsilon_{pp}$ to $\varepsilon_{total}$ is constant. This indicates that at frequencies higher than 1 kHz, the contribution of the composite layer to the total dielectric constant of the film is frequency independent. One can use Equation 16 to fit the data for the frequency range below 1 kHz to estimate the composite layer thickness $d_{BNC}$ and average dielectric constant $\langle\varepsilon\rangle$ (see FIG. 14B). For the sample with thickness $d_{total}$=78.4 µm, $d_{BNC}$=31.2 µm and $\langle\varepsilon\rangle$=7.1; for sample with thickness $d_{total}$=44.5 µm, $d_{BNC}$=18.5 µm and $\langle\varepsilon\rangle$=8.29.

Gas Permeability Measurements:

Gas Permeability was measured by using the MOCON (Minneapolis, Minn.) OX-TRAN 1/50 OTR tester, with the ASTM D-3985 method under the conditions of 23° C. and 0% RH.

EXAMPLE 2

Materials:

Hexagonal boron nitride powder (from UK Abrasives, Inc.), n-heptane (anhydrous, from Alfa Aesar), tetrahydrofuran (Certified from Fisher Chemical), poly(methyl methacrylate) (Approx Mw: 540,000 from Scientific Polymer Products, Inc.), and polypropylene (Isotactic, melt index 20 g/10 min from Sigma-Aldrich Co. LLC) were used as received.

Methods:

A typical procedure of preparing few-layer BN sheets films is described as follows: 2 mg of pristine hBN was first put into a 20 ml scintillation vial. 5 ml organic solvent and 5 ml DI water were then added and the system was bath sonicated for about 15 seconds to break up large particles. Tip sonication was then used for 15 minutes at 40% power amplitude. After the sonication, the vial sat briefly to allow the interfacial trapping and self-assemble to stabilize at the interface. Once the vial was shaken, a continuous white film could be observed on the wall of the glass vial, and a glass slide was put into the vial.

The fact that when hBN is placed into a phase-separated mixture of water and organic solvent, hBN would stay at the interface stably can be explained by the incapability of hBN with either of these two phases and the system is also stabilized by the effect of minimizing high-energy interface of two immiscible liquids.

Figure 15:
FIG. 15 shows boron nitride nanosheets prepared in a scintillation vial by an interfacial trapping technique, where the opaque material above the water is the boron nitride film.

If an organic solvent with a density lower than water, e.g. if heptane is used, BN sheets climb up against gravity onto the glass wall since the heptane vapor filled the atmosphere in the vial, as shown in FIG. 15.

Putting a cleaned glass slide into the vial and shaking the vial vigorously with the cap closed easily prepared the few-layer BN sheets on a flat glass slide. After the glass slide was coated by BN sheets, it was taken out and dried immediately at 70° C., resulting in a dry BN film as shown in FIG. 2A.

Figure 5:
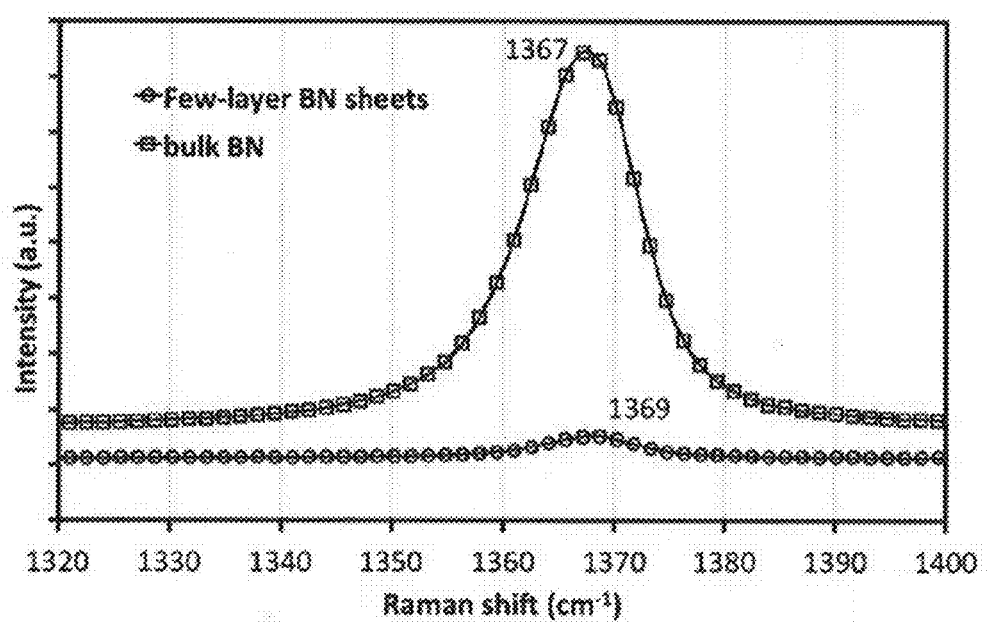
FIG. 5 shows Raman spectra of the bulk hBN and few-layer BN film sample showing changes in integrated intensity and the position of peak (Raman spectroscopy shows the presence of the peak at 1369 cm$^{-1}$, which is correspondent to single layer nano sheet)
Figure 6:
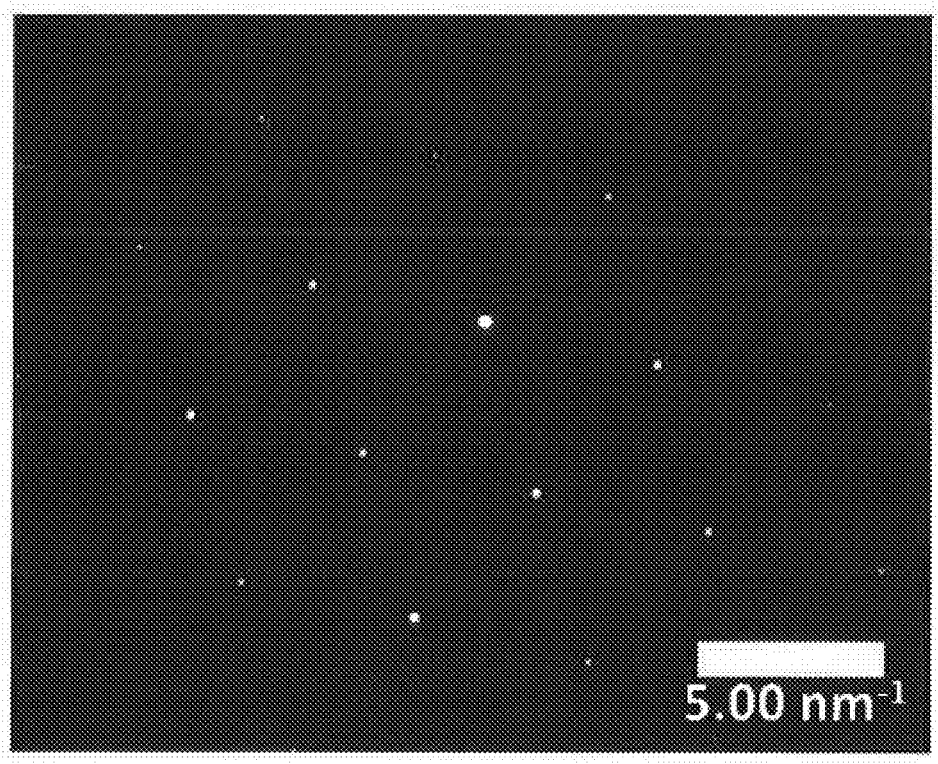
FIG. 6 shows the diffraction pattern of BNNS network in FIG. 1C showing six fold symmetry.
Figure 16:
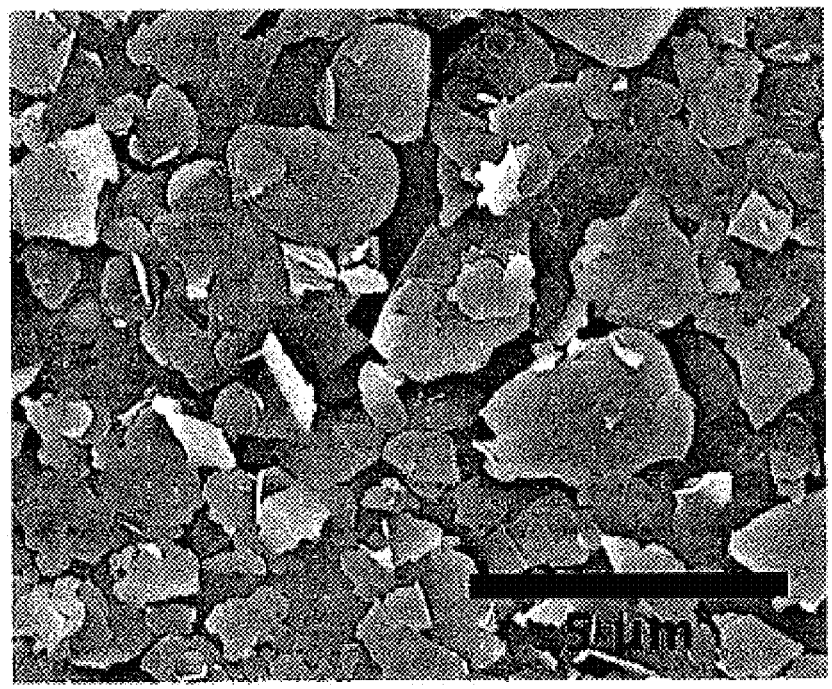
FIG. 16 shows a SEM image of Boron nitride nanosheets network prepared by an interfacial trapping technique.
Figure 17:
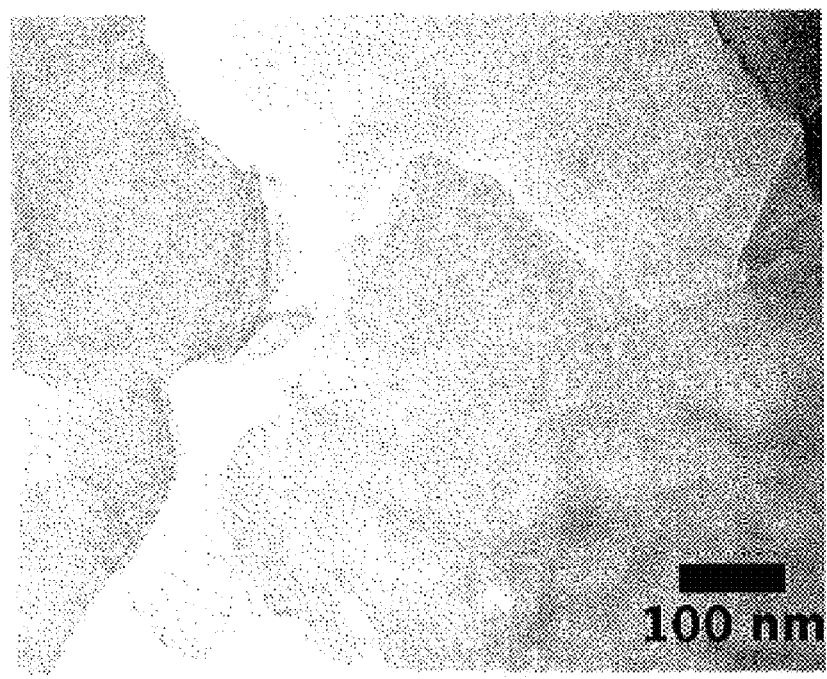
FIG. 17 shows a TEM image of Boron nitride nanosheets network prepared by an interfacial trapping technique.

FIG. 16 is a representative low magnification SEM image, which shows a continuous BN sheets network composed of parallel packed flat sheets with lateral size of about 1 to about 4 microns. The film was also observed under TEM, as shown in FIG. 17. The presence of single layer sheet in the network was proved by Raman spectroscopy, since its characteristic peak at 1369 cm$^{-1}$ was observed (FIG. 5).

Figure 3:
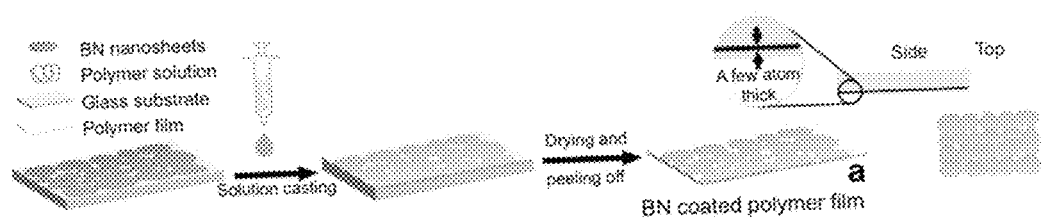
FIG. 3 shows a schematic for the preparation of a polymer film coated with overlapping boron nitride (BN) sheets (scheme of procedure for producing BN coated polymer film by solution casting).

As illustrated in FIG. 3, to incorporate the BN sheets into a polymer matrix, 0.05 g/ml poly(methyl methacrylate) (PMMA) in tetrahydrofuran (THF) solution was drop casted on sheets network. After the THF evaporated, the BN coated PMMA film was first dried at about 50° C. overnight, then could be peeled off from the glass slide with care. After drying under vacuum overnight, the film with BN sheets incorporated in it was obtained. Contacting the film without damaging the surface does not affect the BN sheets network in it.

As portrayed in the side view of BN coated PMMA film in FIG. 3, although very close to the surface, the BN coating interlayer was found to be actually embedded in the polymer matrix.

Figure 18:
FIG. 18 shows a scheme of a procedure for producing BN coated polymer film by heat processing.

To further simplify the solution casting procedure and to expand the selection of polymers, a BN coated polypropylene (PP) film was prepared by a heat processing procedure (FIG. 18) as follows: the glass plate was preheated to 176° C., and a hot pressed PP thin film was put on with care to give a good contact of the whole area. Then it was cooled down after annealing for around 3 minutes, and the BN network was incorporated into the PP matrix. It is noted that at temperatures higher than $T_g$ or heating too fast may result in air bubbles (thus should be avoided).

Figure 19A:
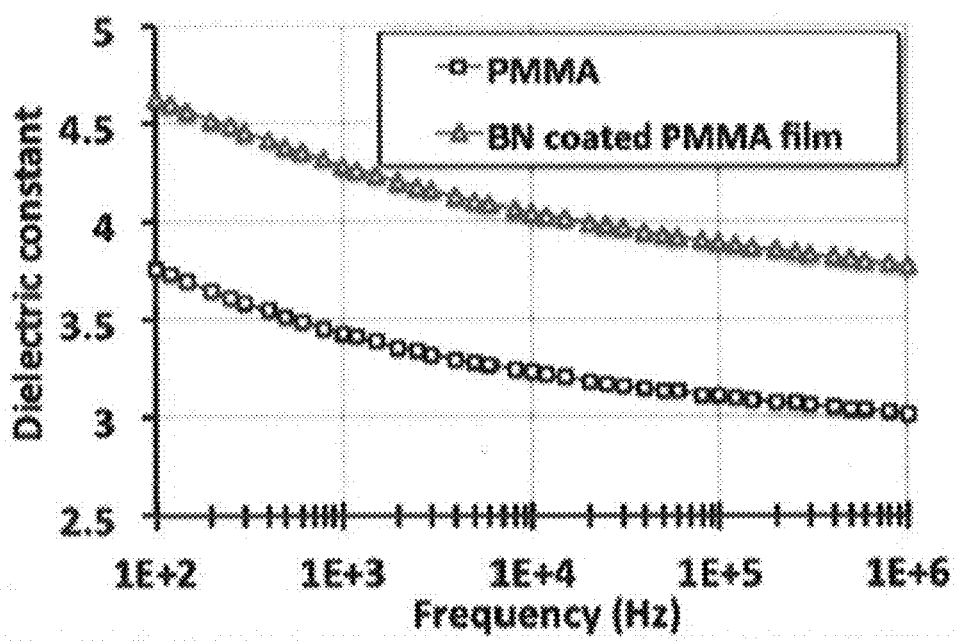
FIGS. 19A and 19B show dielectric properties of BN coated PMMA thin film prepared by a solution casting technique.
Figure 19B:
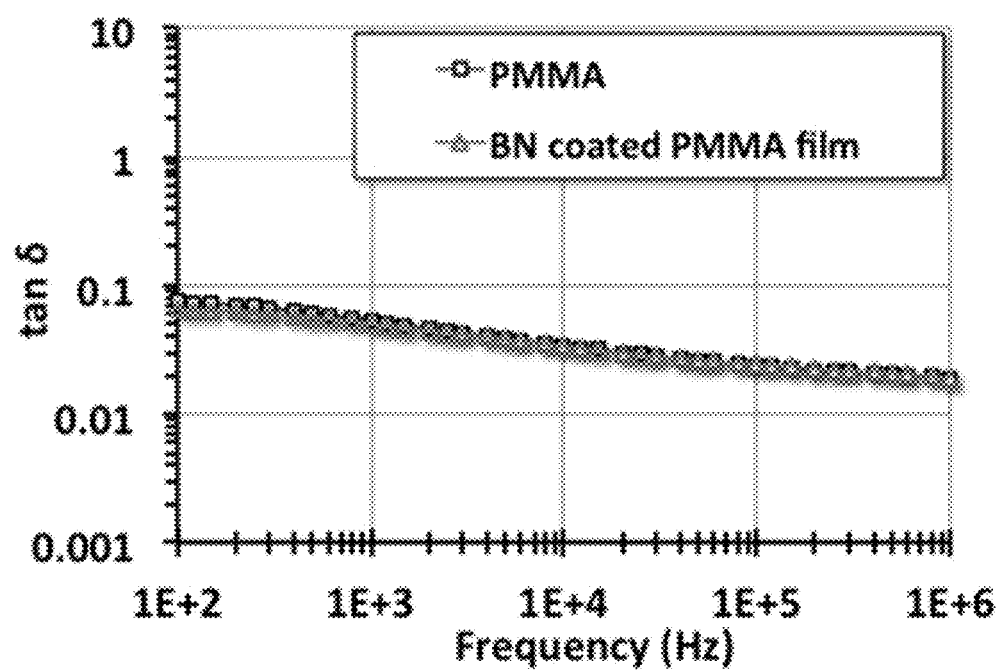

Dielectric properties of BN coated polymer films were investigated in terms of dielectric constant, loss ratio and breakdown field. It was observed that a significant increase in the dielectric constant of few-layer BN sheets coated PMMA, but the loss ratio of coated materials is not affected by the BN sheets (FIGS. 19A-19B).

Figure 20:
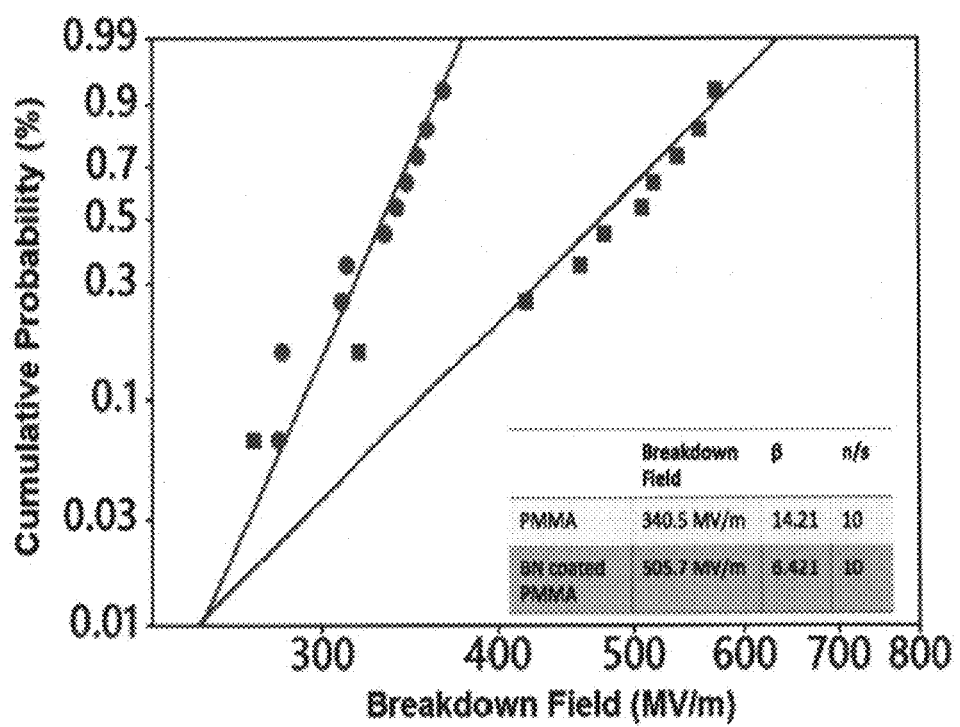
FIG. 20 shows breakdown voltage of BN coated PMMA film prepared by a solution casting technique.

Breakdown strength of few-layer BN coated PMMA film was determined using a linear voltage ramp, and Weibull distribution was applied for analysis. Compared to PMMA, around a 48% increase of breakdown field was observed (FIG. 20), which states the fact that BN sheets interlayer exists as an excellent insulating barrier against space charge conduction and current leakage.

Figure 21:
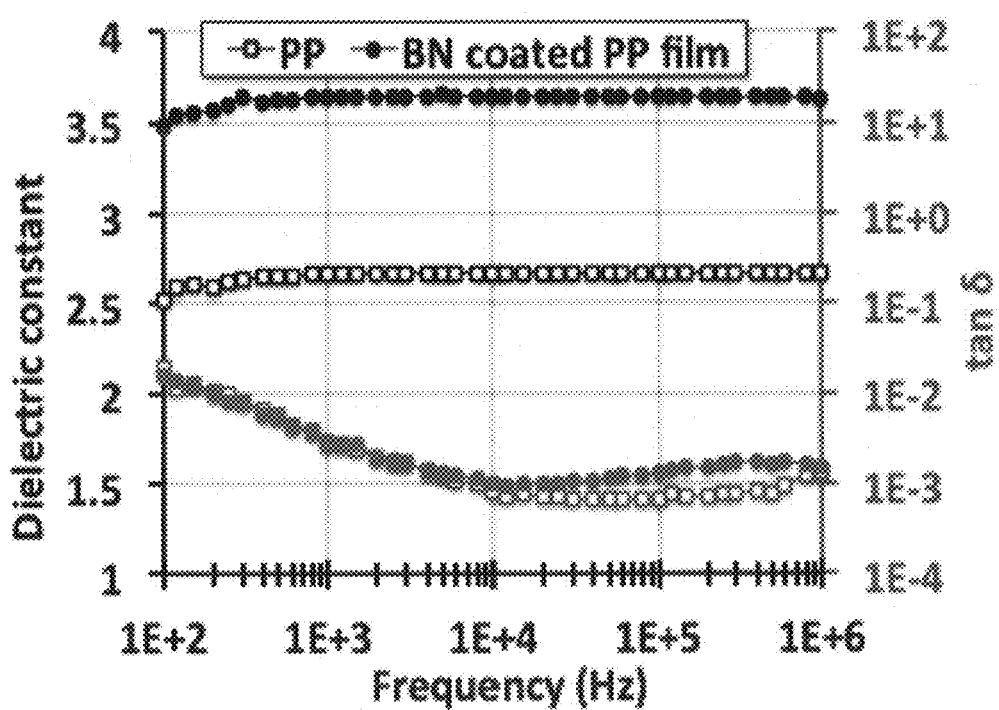
FIG. 21 shows dielectric properties of BN coated polypropylene thin film prepared by a heat processing technique.

Dielectric constant and loss were also investigated on heat processed PP film coated with BN layer. Around a 40% improvement on dielectric constant was achieved with loss ratio unaffected compared to neat PP films treated by the exact same method but without BN sheets (FIG. 21).

REFERENCES

Coleman et al., Science 2011, 331 (6017), 568-571.
Wang et al., Adv Mater 2011, 23 (35), 4072-4076.
Pierret et al., Phys Rev B 2014, 89 (3), 035414.
Watanabe et al., Nat Mater 2004, 3 (6), 404-409.
Zunger et al., Phys Rev B 1976, 13 (12), 5560-5573.
Young et al., Phys Rev B 2012, 85 (23), 235458.
Dean et al., Nature Nanotech 2010, 5 (10), 722-6.
Kim et al., ACS Nano 2012, 6 (10), 8583-8590.
Li et al., Adv Mater 2014, 26 (36), 6244-6249.
Takahashi et al., J Alloys Compd 2014, 615 (0), 141-145.
Wang et al., Nanoscale Res Lett 2012, 7 (1), 1-7.
Zhang et al., Adv Mater 2014, 26 (11), 1776-1781.
Liu et al., Nano Lett. 2011, 11 (5), 2032-2037.
Osada et al., Adv Mater 2012, 24 (2), 210-228.
Britnell et al., Science 2012, 335 (6071), 947-950.
Lee et al., Nano Lett. 2012, 12 (2), 714-718.
Wang et al., Adv Mater 2014, 26 (10), 1559-1564.
Wang et al., Adv Mater 2013, 25 (19), 2746-2752.
Zhang et al., Adv Mater 2015, 27 (8), 1450-54.
Song et al., Nano Lett. 2010, 10 (8), 3209-3215.
Gorbachev et al., Small 2011, 7 (4), 465-468.
Woltornist et al., Macromolecules 2015, 48 (3), 687-693.
U.S. Patent Pub. No. 2007/0108490.

Whereas the disclosure has been described principally in connection with boron nitride, such description has been utilized for purposes of disclosure and is not intended as limiting the disclosure. To the contrary, it is recognized that the disclosed systems, methods, techniques and assemblies are capable of use with other materials having a layered structure or the like, such as, for example, graphite, graphene, graphene oxide, etc.

Although the systems and methods of the present disclosure have been described with reference to exemplary embodiments thereof, the present disclosure is not limited to such exemplary embodiments and/or implementations. Rather, the systems and methods of the present disclosure are susceptible to many implementations and applications, as will be readily apparent to persons skilled in the art from the disclosure hereof. The present disclosure expressly encompasses such modifications, enhancements and/or variations of the disclosed embodiments. Since many changes could be made in the above construction and many widely different embodiments of this disclosure could be made without departing from the scope thereof, it is intended that all matter contained in the drawings and specification shall be interpreted as illustrative and not in a limiting sense. Additional modifications, changes, and substitutions are intended in the foregoing disclosure. Accordingly, it is appropriate that the appended claims be construed broadly and in a manner consistent with the scope of the disclosure.

The invention claimed is:
1. A method for fabricating a composite film comprising:
   a) providing a phase separated system, the phase separated system including: (i) a first material and a second material, and (ii) an interface between the first and second materials;
   b) introducing a layered material to the phase separated system;
   c) inserting a substrate into the interface of the phase separated system and allowing at least a portion of the layered material to be associated with the substrate;

d) removing the substrate from the phase separated system and allowing the portion of the layered material associated with the substrate to dry; and
e) introducing a polymer to the layered material to form a composite film.

2. The method of claim 1, wherein the layered material includes boron nitride.

3. The method of claim 2, wherein the layered material is hexagonal boron nitride.

4. The method of claim 1, wherein the layered material of the composite film includes individual sheets or layers of boron nitride.

5. The method of claim 1, wherein the layered material of the composite film has a total thickness of about one nanometer.

6. The method of claim 1, wherein the layered material of the composite film includes overlapping boron nitride sheets or layers.

7. The method of claim 1, wherein the layered material of the composite film includes from about one sheet or layer to about nine sheets or layers of boron nitride, and wherein there are gaps in the composite film with no layered material.

8. The method of claim 1, wherein after step e), the layered material is an interlayer of the composite film.

9. The method of claim 1, wherein step e) includes embedding the layered material into the polymer to form the composite film.

10. The method of claim 1, further comprising, after step e), the step of removing the composite film from the substrate.

11. The method of claim 1, wherein the step of introducing the polymer to the layered material includes drop casting a polymer solution onto the dried layered material; and
further comprising, after step e), the steps of allowing the polymer solution to dry, and removing the dried composite film from the substrate.

12. The method of claim 1, wherein step e) includes coating the polymer onto the layered material to form the composite film.

13. The method of claim 1, wherein the formed composite film has a low frequency dielectric constant around 5, and an energy storage capacity around 4.9 J/cm$^3$.

14. The method of claim 1, wherein the polymer includes poly(methyl-methacrylate) or polypropylene.

15. The method of claim 1, wherein the phase separated system is an oil and water based system.

16. The method of claim 1, wherein the phase separated system is a system of two substantially non-mixing solvents.

17. The method of claim 1, wherein the first material is water and the second material is heptane.

18. The method of claim 1, wherein the step of introducing the polymer to the layered material includes hot pressing a polymer film to the dried layered material.

19. A method for fabricating a composite film comprising:
a) providing a phase separated system, the phase separated system including: (i) a first material and a second material, and (ii) an interface between the first and second materials;
b) introducing boron nitride to the phase separated system;
c) inserting a substrate into the interface of the phase separated system and allowing at least a portion of the boron nitride to be associated with the substrate; and
d) removing the substrate from the phase separated system and allowing the portion of the boron nitride associated with the substrate to dry; and
e) introducing a polymer to the dried boron nitride to form a composite film;
wherein boron nitride of the composite film includes individual sheets or layers of boron nitride;
wherein the boron nitride of the composite film has a total thickness of about one nanometer;
wherein the boron nitride of the composite film includes overlapping boron nitride sheets or layers; and
wherein after step e), the boron nitride is an interlayer of the composite film.

* * * * *